(12) United States Patent
Ikeda et al.

(10) Patent No.: US 8,848,124 B2
(45) Date of Patent: Sep. 30, 2014

(54) ACTIVE MATRIX SUBSTRATE, MANUFACTURING METHOD THEREOF, AND IMAGE DISPLAY DEVICE

(75) Inventors: Noriaki Ikeda, Tokyo (JP); Chihiro Imamura, Tokyo (JP); Manabu Ito, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 77 days.

(21) Appl. No.: 13/431,935

(22) Filed: Mar. 27, 2012

(65) Prior Publication Data

US 2012/0262642 A1 Oct. 18, 2012

Related U.S. Application Data

(63) Continuation of application No. PCT/JP2010/366299, filed on Sep. 21, 2010.

(30) Foreign Application Priority Data

Sep. 28, 2009 (JP) .................................. 2009-222682
Sep. 28, 2009 (JP) .................................. 2009-222683
Sep. 28, 2009 (JP) .................................. 2009-222684

(51) Int. Cl.
*G02F 1/136* (2006.01)
*H01L 29/66* (2006.01)
*H01L 29/417* (2006.01)
*H01L 27/12* (2006.01)
*G02F 1/1368* (2006.01)
*H01L 27/32* (2006.01)

(52) U.S. Cl.
CPC ......... *H01L 27/3248* (2013.01); *H01L 27/3262* (2013.01); *H01L 27/3258* (2013.01); *H01L 29/66765* (2013.01); *H01L 29/41733* (2013.01); *H01L 27/124* (2013.01); *H01L 27/1225* (2013.01); *G02F 1/1368* (2013.01)
USPC .......................................................... 349/43

(58) Field of Classification Search
USPC .......................................................... 349/43
See application file for complete search history.

(56) References Cited

U.S. PATENT DOCUMENTS

| | | | |
|---|---|---|---|
| 6,674,106 B2 * | 1/2004 | Tanaka et al. | 257/222 |
| 6,855,954 B1 * | 2/2005 | Zhang | 257/59 |
| 7,522,226 B2 * | 4/2009 | Park et al. | 349/43 |
| 2009/0167974 A1 * | 7/2009 | Choi et al. | 349/43 |

FOREIGN PATENT DOCUMENTS

CN 1522470 A 8/2004

(Continued)

OTHER PUBLICATIONS

Notification of Reasons for Refusal for appl. No. 2011-526316, dispatched Sep. 13, 2011, 5 pgs.

(Continued)

*Primary Examiner* — Wen-Ying P Chen
(74) *Attorney, Agent, or Firm* — Squire Patton Boggs (US) LLP

(57) ABSTRACT

According to the first aspect of the present invention, a drain electrode and a pixel electrode are electrically connected to each other on a protective film formed on a semiconductor active layer, and thereby it is possible to easily connect the drain electrode and the pixel electrode to each other and to improve a yield.

13 Claims, 38 Drawing Sheets

(56) References Cited

FOREIGN PATENT DOCUMENTS

| | | |
|---|---|---|
| JP | 06-242433 | 9/1994 |
| JP | 08-201853 | 8/1996 |
| JP | 11-190838 | 7/1999 |
| JP | 2001-119029 | 4/2001 |
| JP | 2003-017706 | 1/2003 |
| JP | 2007-140468 | 6/2007 |
| JP | 2007-333809 | 12/2007 |
| JP | 2009-135380 | 6/2009 |
| JP | 2009-192667 | 8/2009 |

OTHER PUBLICATIONS

Translation of the Notification of Reasons for Refusal for appl. No. 2011-526316, dispatched Sep. 13, 2011, 8 pgs.

English Translation of the International Preliminary Report on Patentability mailed Apr. 19, 2012 for International Patent Application No. PCT/JP2010/066299, 10 pages.

First Notice of Opinion on Examination and its translation from the State Intellectual Property Office of China mailed Mar. 26, 2014, 33 pgs.

\* cited by examiner

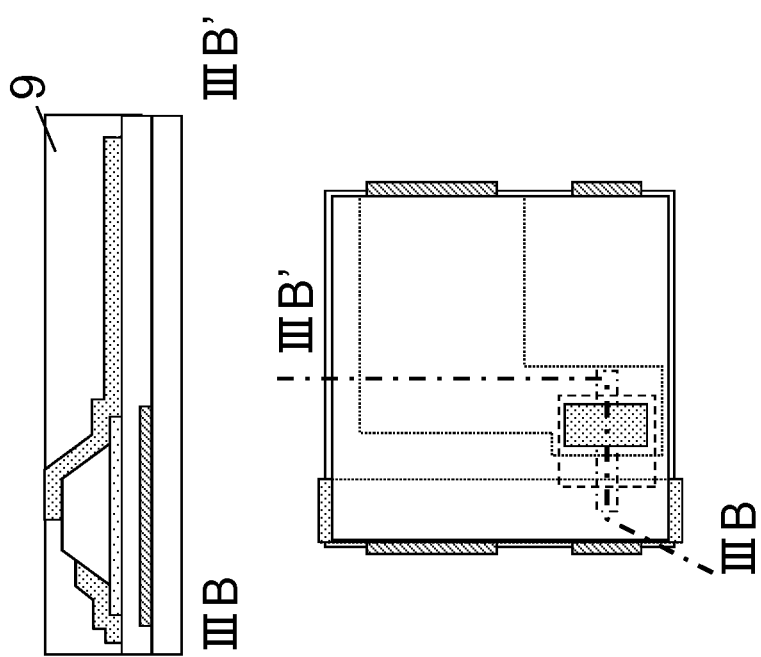

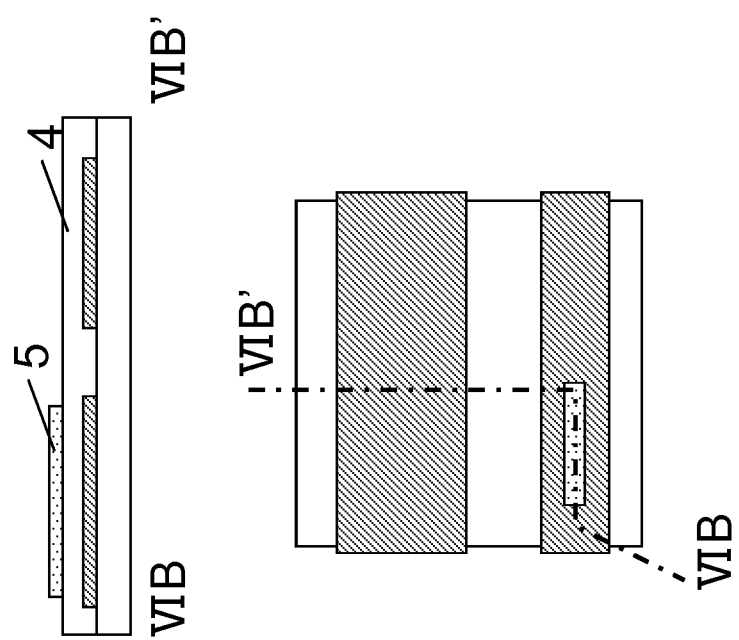

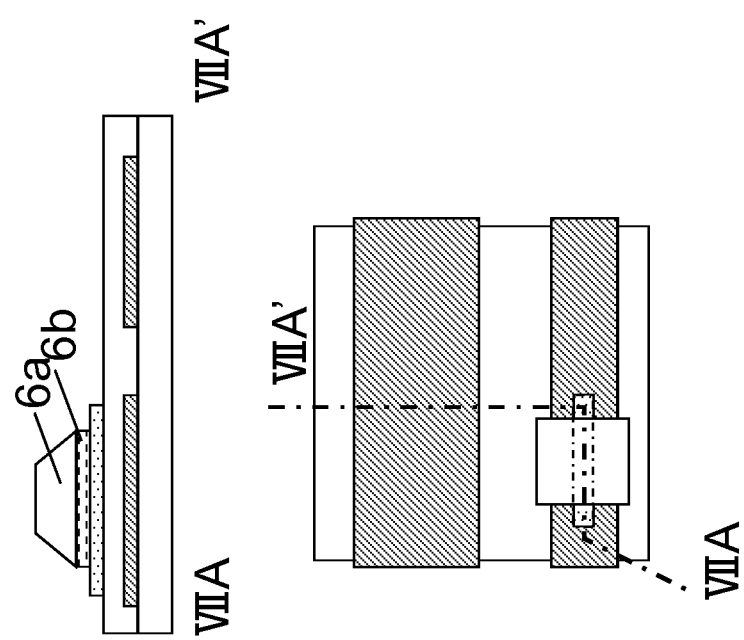

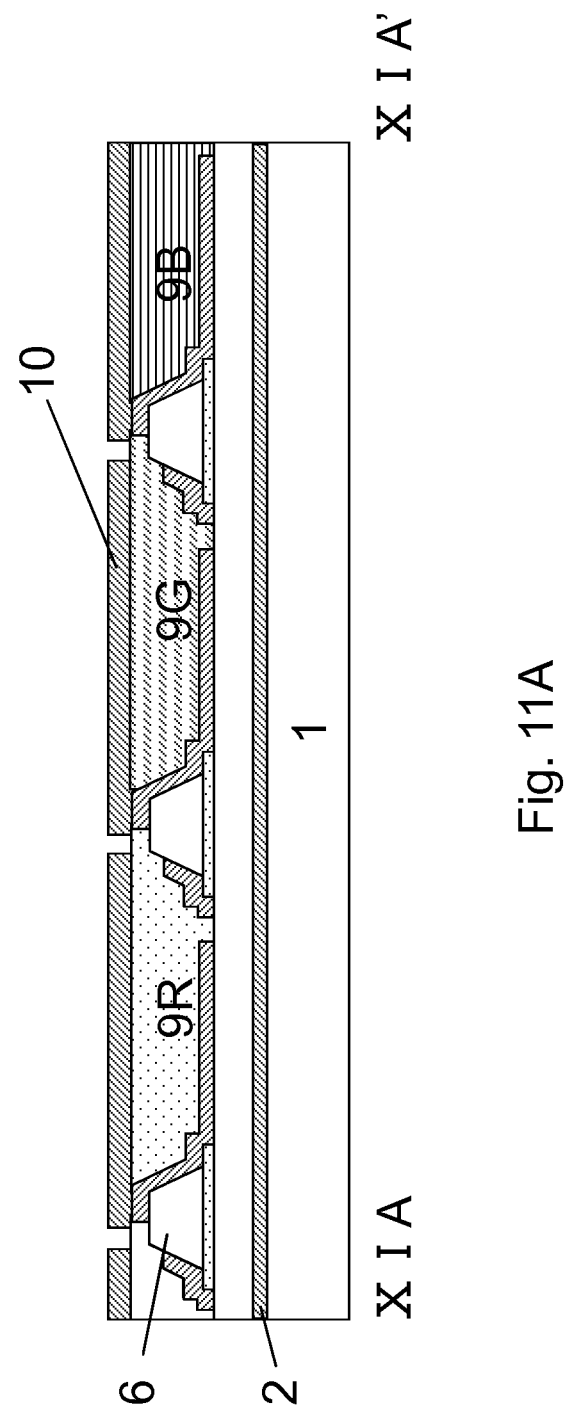

ACTIVE MATRIX SUBSTRATE, MANUFACTURING METHOD THEREOF, AND IMAGE DISPLAY DEVICE

CROSS REFERENCE TO RELATED APPLICATION

This application is a continuation of International Application No. PCT/JP2010/066299, the entire contents of which is incorporated herein by reference.

This application is based upon and claims the benefit of priority from the prior Japanese Patent Application No. 2009-222682, filed on Sep. 28, 2009, Japanese Patent Application No. 2009-222683, filed on Sep. 28, 2009, Japanese Patent Application No. 2009-222684, filed on Sep. 28, 2009, the entire contents of which are incorporated herein by reference.

BACKGROUND OF THE INVENTION

1. Field of the Invention

The present invention relates to an active matrix substrate where thin film transistors are arranged in an array form, and an image display device using the active matrix substrate.

2. Background Art

In recent years, as image display devices, active matrix type liquid crystal displays, organic electroluminescence display devices, and electrophoretic display devices have been used.

Particularly, in the liquid crystal displays and the electrophoretic display devices, in order to display color images, color filters are generally used, and an image display element such as a liquid crystal layer or an electrophoretic particle layer is provided between an active matrix substrate on which semiconductor circuits are formed and a color filter substrate.

However, the image display device having such a structure has a problem in that since electrodes are not formed in a region where the TFTs (thin film transistors) are formed, a region for driven display elements is small, and an aperture ratio is low. In addition, in a case of the liquid crystal display, there is a problem in that a light leakage defect due to errors in position alignment between the active matrix substrate and the color filter substrate occurs, and a light blocking layer is formed to be large in order to give a margin to the errors in the position alignment for preventing the light leakage, and, as a result, an aperture ratio is lowered. In addition, in a case of the electrophoretic display device, a method of using micro-capsules as the electrophoretic particle layer is generally used, but a thickness of the micro-capsule layer is thick as 40 µm, and thus position alignment between the active matrix substrate and the color filter substrate is difficult, and a yield is low.

In order to solve the problem of the low aperture ratio, there is known an active matrix substrate having a configuration where an interlayer insulating layer is formed on the TFT, a pixel electrode is formed thereon, and a drain electrode and the pixel electrode are connected to each other via a through-hole portion provided at the interlayer insulating layer. Further, Japanese Patent No. 3383047 discloses a method in which an active matrix substrate having a COA (Color Filter On Array) structure where a color filter layer is formed on the TFT is used as a structure of the image display device using such an active matrix substrate, and thus errors in position alignment between the active matrix substrate and the color filter substrate is improved, thereby improving the aperture ratio. The active matrix substrate having the COA structure is provided with a through-hole at the color filter layer and the interlayer insulating layer in order to electrically connect the drain electrode and the pixel electrode.

Patent document 1: JP-B-3383047

SUMMARY OF THE INVENTION

However, there is a problem in that a film thickness of the interlayer insulating layer is large as 1 µm to 3 µm, and since a pixel size becomes smaller as a pattern of the TFTs is increasingly much fined, it is difficult to favorably form a through-hole portion such that the drain electrode and the pixel electrode are reliably connected to each other, and thus a yield is reduced.

In addition, although the drain electrode and the pixel electrode are favorably electrically connected to each other by increasing an area of the through-hole portion, increasing the through-hole portion at the interlayer insulating layer leads to decrease in an area of the color filter region, and thus a substantial aperture ratio is lowered.

The present invention has been made in consideration of the problems, and an object thereof is to provide an active matrix substrate where the drain electrode and the pixel electrode at the TFT (thin film transistor) are easily connected to each other and an aperture ratio is high, and an image display device.

In order to solve the problems, according to a first aspect of the present invention, there is provided an active matrix substrate including plural pixels which are arranged on a substrate and each of which includes a thin film transistor, wherein the thin film transistor includes a gate electrode, a gate insulating layer on the gate electrode, a semiconductor active layer on the gate insulating layer, a source electrode connected to the semiconductor active layer, a drain electrode connected to the semiconductor active layer, a pixel electrode connected to the drain electrode, and an interlayer insulating layer for insulating the source electrode from the pixel electrode, and wherein a protective film is formed on the semiconductor active layer so as to divide the semiconductor active layer into two exposed regions, the source electrode is connected to one of the two exposed regions, the drain electrode is connected to the other of the two exposed regions, and the drain electrode is connected to the pixel electrode on the protective film.

According to the first aspect of the present invention, the drain electrode and the pixel electrode are electrically connected to each other on the protective film formed on the semiconductor active layer, and thereby it is possible to easily connect the drain electrode and the pixel electrode to each other and to improve a yield.

According to a second aspect of the present invention, in the first aspect, the plural thin film transistors may be arranged in a straight line shape, and plural independent semiconductor active layers which respectively constitute the plural thin film transistors may be arranged in parallel in a straight line shape, and the protective film may be formed in a stripe shape over the plural semiconductor active layers so as to divide each of the plural semiconductor active layers into two exposed regions.

According to the second aspect of the present invention, the drain electrode and the pixel electrode are electrically connected to each other on the protective film formed on the semiconductor active layer, and thereby it is possible to easily connect the drain electrode and the pixel electrode to each other and to improve a yield. Further, a single stripe-shaped protective film can be also used as protective films of plural TFTs.

According to a third aspect of the present invention, in the first aspect, the protective film may be formed in a lattice shape for partitioning the pixels, and be formed so as to have a light blocking property.

According to the third aspect of the present invention, the drain electrode and the pixel electrode are electrically connected to each other on the protective film formed on the semiconductor active layer, and thereby it is possible to easily connect the drain electrode and the pixel electrode to each other and to improve a yield. Further, a single light blocking protective film having a lattice shape can be also used as protective films of plural TFTs and a black matrix.

According to a fourth aspect of the present invention, in the first aspect, the protective film may be formed in a forward tapered shape.

According to a fifth aspect of the present invention, in the first aspect, the protective film may be formed from an organic insulating material.

According to a sixth aspect, in the first aspect, the protective film may be formed of plural layers, and one layer of the plurality of layers coming into contact with at least the semiconductor active layer may include an inorganic insulating material.

According to a seventh aspect of the present invention, in the first aspect, the interlayer insulating layer may be pigmented with a predetermined color. According to the fifth aspect of the present invention, the interlayer insulating layer is pigmented with a predetermined color, and thereby the active matrix substrate may have a COA (Color Filter On Array) structure where a color filter array is formed on a thin film transistor. When the active matrix substrate has the COA structure, position alignment between semiconductor circuits and color filters is easily performed, and thus it is possible to provide an active matrix substrate having a high aperture ratio.

According to an eighth aspect of the present invention, in the first aspect, the semiconductor active layer may be formed from a metal oxide.

According to a ninth aspect of the present invention, in the first aspect, an image display type may be any one of a liquid crystal type, an organic electroluminescence type, and an electrophoretic type.

According to a tenth aspect of the present invention, there is provided a manufacturing method of an active matrix substrate including plural pixels arranged on a substrate and each of which includes a thin film transistor, wherein the thin film transistor includes a gate electrode, a gate insulating layer on the gate electrode, a semiconductor active layer on the gate insulating layer, a source electrode connected to the semiconductor active layer, a drain electrode connected to the semiconductor active layer, a pixel electrode connected to the drain electrode, and an interlayer insulating layer for insulating the source electrode from the pixel electrode, the method including forming the gate electrode on the substrate; forming the gate insulating layer on the gate electrode; forming the semiconductor active layer on the gate insulating layer; forming a protective film on the semiconductor active layer so as to divide the semiconductor active layer into two exposed regions; forming a layer formed from a conductive material on the protective film, the semiconductor active layer, and an entire surface of the gate insulating layer; forming a layer formed from a conductive material through patterning such that the source electrode is connected to one of the two exposed regions, the drain electrode is connected to the other of the two exposed regions, and the drain electrode is left on the protective film; forming an interlayer insulating layer on an entire surface of the substrate; providing an opening portion in the interlayer insulating layer on the protective film; and forming a pixel electrode on the interlayer insulating layer and electrically connecting the pixel electrode to the drain electrode.

According to an eleventh aspect of the present invention, in the tenth aspect, in the forming of the protective film on the semiconductor active layer so as to divide the semiconductor active layer into the two exposed regions, the protective film may be formed in a strip shape on each of the plural semiconductor active layers respectively constituting the plural thin film transistors so as to divide the semiconductor active layer into the two exposed regions.

According to a twelfth aspect of the present invention, in the eleventh aspect, the protective film may be formed in the strip shape using a printing method.

According to a thirteenth aspect of the present invention, in the tenth aspect, in the forming of the protective film on the semiconductor active layer so as to divide the semiconductor active layer into the two exposed regions, a lattice-shaped light blocking protective film may be formed on the semiconductor active layer so as to divide the semiconductor active layer into the two exposed regions and partition the pixels from each other.

According to a fourteenth aspect of the present invention, in the tenth aspect, the forming of the protective film may include forming a first protective film on the entire surface of the substrate; forming a second protective film so as to divide the semiconductor active layer into the two exposed regions; and removing the first protective film exposed from the second protective film through etching.

According to a fifteenth aspect of the present invention, in the tenth aspect, the manufacturing method may further include performing plasma irradiation for a region exposed from the protective film on the semiconductor active layer after forming the protective film.

According to the aspects of the present invention, it is possible to provide an active matrix substrate and an image display device where the drain electrode and the pixel electrode are easily connected to each other in semiconductor circuits, position alignment between the semiconductor circuit and color filters is easily performed, and thereby a yield is high and an aperture ratio is high.

BRIEF DESCRIPTION OF THE DRAWINGS

FIGS. 3A to 3C are schematic cross-sectional views and plan views illustrating manufacturing steps of an active matrix substrate according to a first embodiment of the present invention, wherein the schematic cross-sectional views (upper parts) are respectively taken along the lines IIIA-IIIA', IIIB-IIIB', and IIIC-IIIC' of the plan views (lower parts).

FIGS. 6A to 6D are schematic cross-sectional views and plan views illustrating manufacturing steps of an active matrix substrate according to another embodiment of the present invention, wherein the schematic cross-sectional views (upper parts) are respectively taken along the lines VIA-VIA', VIB-VIB', VIC-VIC', and VID-VID' of the plan views (lower parts).

FIGS. 7A to 7D are schematic cross-sectional views and plan views illustrating manufacturing steps of an active matrix substrate according to another embodiment of the present invention, wherein the schematic cross-sectional views (upper parts) are respectively taken along the lines VIIA-VIIA', VIIB-VIIB', VIIC-VIIC', and VIID-VIID' of the plan views (lower parts).

FIGS. 11A and 11B are respectively a schematic cross-sectional view and a plan view illustrating the active matrix substrate according to the second embodiment of the present invention where the interlayer insulating layer is used as a color filter layer, wherein the schematic cross-sectional view of FIG. 11A is taken along the line XIB-XIB' of the plan view of FIG. 11B.

FIGS. 12A and 12B are respectively a schematic cross-sectional view and a plan view illustrating an active matrix substrate according to a third embodiment of the present invention, wherein FIG. 12A is a schematic cross-sectional view taken along the line XIIA-XIIA' of the plan view of FIG. 12B.

DETAILED DESCRIPTION OF THE INVENTION

Figure 1:
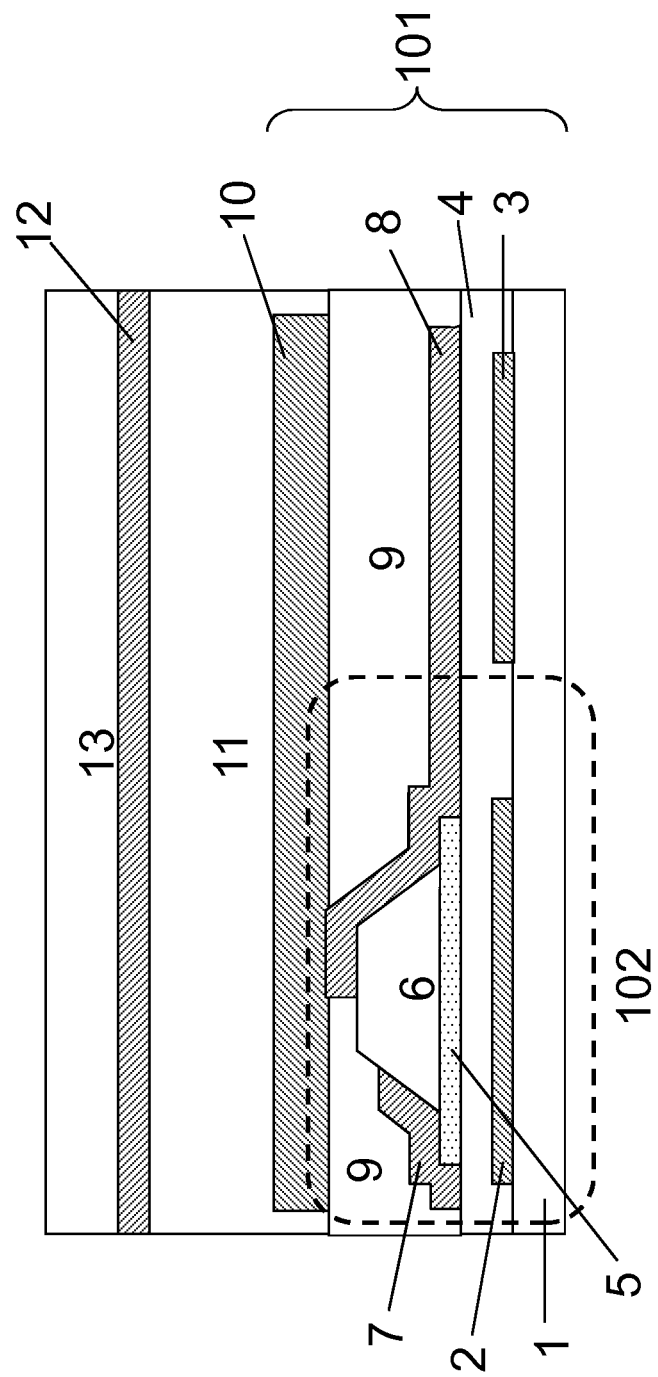
FIG. 1 is a schematic cross-sectional view for almost one pixel of an image display device according to an embodiment of the present invention.

Hereinafter, embodiments of the present invention will be described with reference to the drawings. In addition, in the embodiments, the same constituent elements are given the same reference numerals, and repeated description will be omitted in the embodiments.

FIG. 1 is a schematic cross-sectional view for almost one pixel of an image display device according to an embodiment of the present invention. The image display device of the present invention includes an active matrix substrate 101, an opposite substrate 13 on which an opposite electrode 12 is formed, and an image display element 11 interposed between the opposite electrode and a pixel electrode 10 on the active matrix substrate 101. A thin film transistor 102 and the pixel electrode connected thereto are arranged with an interlayer insulating layer 9 interposed therebetween, thereby forming the active matrix substrate of the present invention. Each thin film transistor is electrically wired by wires including a gate wire connected to a gate electrode and a source wire connected to a source electrode, so as to constitute a TFT array circuit.

The thin film transistor configuring the present invention includes a gate electrode 2, a gate insulating layer 4 which is formed on the gate electrode so as to cover the gate electrode, a semiconductor active layer 5 formed on the gate insulating layer, and a source electrode 7 and a drain electrode 8 connected to the semiconductor active layer. In addition, a protective film 6 is formed on the semiconductor active layer so as to divide the semiconductor active layer into two regions, and the source electrode and the drain electrode respectively come into contact with the divided semiconductor active regions, and are electrically connected to each other. Further, the drain electrode covers a part of the protective film, and is thereby connected to the pixel electrode 10. A capacitor electrode 3 is formed under the drain electrode with the gate insulating layer interposed therebetween.

The present invention may be divided into first to third embodiments depending on a form of the protective film 6, and portions other than the protective film 6 and structures caused by the protective film 6 may be formed using the same materials and same methods in any embodiments.

First, a first embodiment of the present invention will be described.

FIG. 1 is a schematic cross-sectional view for almost one pixel of an image display device according to the first embodiment of the present invention. The image display device of the present invention includes the active matrix substrate 101, the opposite substrate 13 on which an opposite electrode 12 is formed, and the image display element 11 interposed between the opposite electrode and the pixel electrode 10 on the active matrix substrate 101. The thin film transistor 102 and the pixel electrode connected thereto are arranged with an interlayer insulating layer 9 interposed therebetween, thereby forming the active matrix substrate of the present invention. Each thin film transistor is electrically wired by wires including a gate wire connected to the gate electrode and a source wire connected to the source electrode, so as to constitute a TFT array circuit.

The thin film transistor configuring the present invention includes the gate electrode 2, the gate insulating layer 4 which is formed on the gate electrode so as to cover the gate electrode, the semiconductor active layer 5 formed on the gate insulating layer, and the source electrode 7 and the drain electrode 8 connected to the semiconductor active layer. In addition, the protective film 6 is formed on the semiconductor active layer so as to divide the semiconductor active layer into two regions, and the source electrode and the drain electrode respectively come into contact with the divided semiconductor active regions, and are electrically connected to each other. Further, the drain electrode covers a part of the protective film, and is thereby connected to the pixel electrode 10. The capacitor electrode 3 is formed under the drain electrode with the gate insulating layer interposed therebetween. The protective film 6 is formed in an island shape on the semiconductor active layer in the first embodiment.

Figure 5:
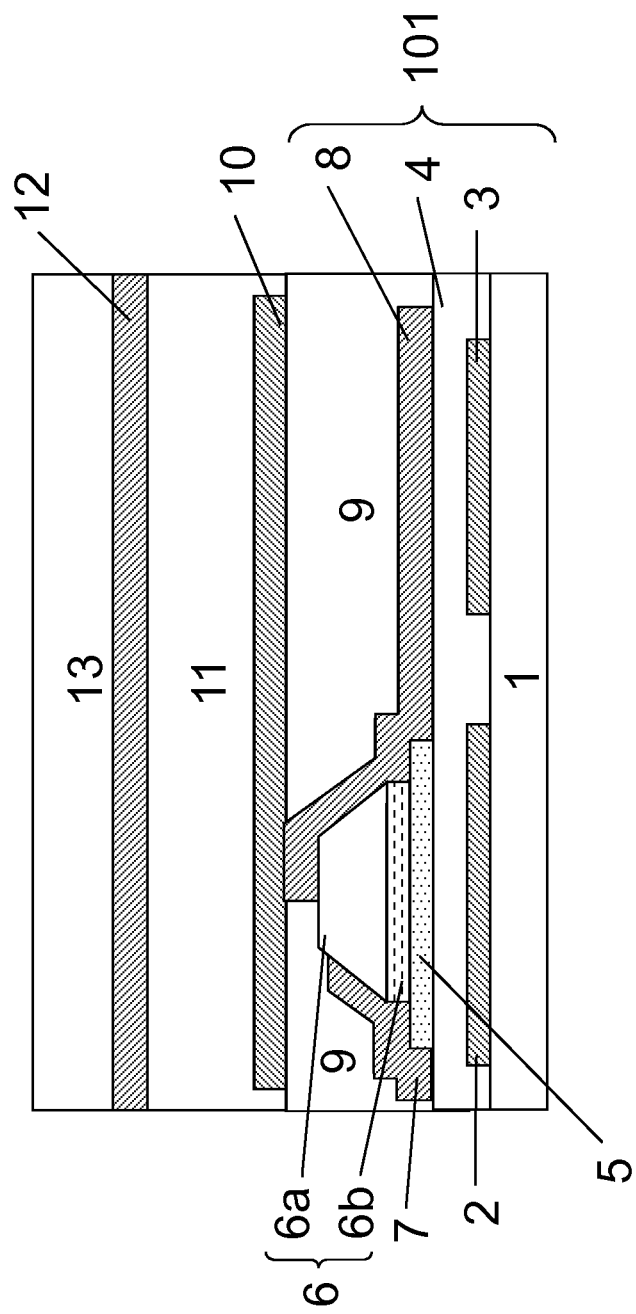
FIG. 5 is a schematic cross-sectional view for almost one pixel of an image display device according to another embodiment of the present invention.

Further, as shown in FIG. 5, a layer formed of plural protective films may be used as another aspect of the present invention. In FIG. 5, a first protective layer 6a and a second protective film 6b having different characteristics or formed of different materials are laminated. With this, the lower protective film can protect the semiconductor active layer 5, and thus a degree of freedom for materials of the upper protective film is increased. In addition, as described later, the lower protective film can be patterned using the upper protective film, and thus it is advantageous in terms of manufacturing steps.

In the image display device of the present invention, if the substrate of the active matrix substrate 101 and predetermined constituent elements of the thin film transistor are made to be substantially transparent, it is possible to realize image display with a configuration where the display element 11 is viewed from the active matrix substrate side. In this case, the respective wires, electrodes, and the gate insulating layers of the active matrix substrate are substantially transparent. The semiconductor active layer is preferably formed of a metal oxide semiconductor which can be substantially transparent. In addition, even in a case of partially using a material which is not transmissive, each constituent element in the display region of the display device is preferably substantially transparent. Here, the term "substantially transparent" means that the transmittance is 70% or more in a range of the wavelength region of 400 nm or more to 700 nm or less which is visible light. Here, if a pigmented layer is formed at the interlayer insulating layer which is then used as color filter, it gives an active matrix substrate of the COA structure. The protective film 6 may have any property of transparency, pigmentation, and light blocking by the active matrix substrate configuration.

Hereinafter, each constituent element of the present invention will be described in detail according to manufacturing steps of the active matrix substrate.

The substrate 1 according to the embodiment of the present invention may use, specifically, polymethyl methacrylate, polyacrylate, polycarbonate, polystyrene, polyethylene sulfide, polyetheresulfone, polyolefine, polyethylene terephthalate, polyethylene naphthalate, cyclo-olefin polymer, polyetheresulfone, polyvinyl fluoride film, ethylene-tetrafluoroethylene copolymer resin, weather resistance polypropylene, glass fiber reinforced acryl resin film, glass fiber reinforced polycarbonate, transparent polyimide, fluorine-based resin, cyclic polyolefin resin, glass, and quartz, but the present invention is not limited thereto. They may be used singly as a substantially transparent substrate 1, or may be used in a composite manner through lamination of two kinds of materials as a substantially transparent substrate 1.

In a case where the substantially transparent 1 according to the embodiment of the present invention is formed of an organic film, a transparent gas barrier layer (not shown) may be formed in order to improve durability of the elements on the active matrix substrate. As the gas barrier layer, aluminum oxide ($Al_2O_3$), silicon dioxide ($SiO_2$), silicon nitride (SiN), silicon oxynitride (SiON), silicon carbide (SiC), diamond-like carbon (DLC), and the like may be used, and the present invention is not limited thereto. In addition, the gas barrier layer may use two or more layers which are laminated. The gas barrier layer may be formed on a single side of the substantially transparent substrate 1 using an organic film, or may be formed on both sides. The gas barrier layer may be formed using a vacuum deposition method, an ion plating method, a sputtering method, a laser ablation method, a plasma CVD (Chemical Vapor Deposition) method, a hot wire CVD method, a sol-gel method, and the like, and the present invention is not limited thereto.

First, agate electrode, a capacitor electrode, and each wire are formed on the substrate. The electrode parts and the wire parts are not necessarily divided clearly, and, in the present invention, constituent elements of each thin film transistor are referred to as electrodes. In addition, in a case where it is not necessary to differentiate the electrodes from the wires, description is made as a gate, a source, a drain, a capacitor, and the like.

Figure 2A:
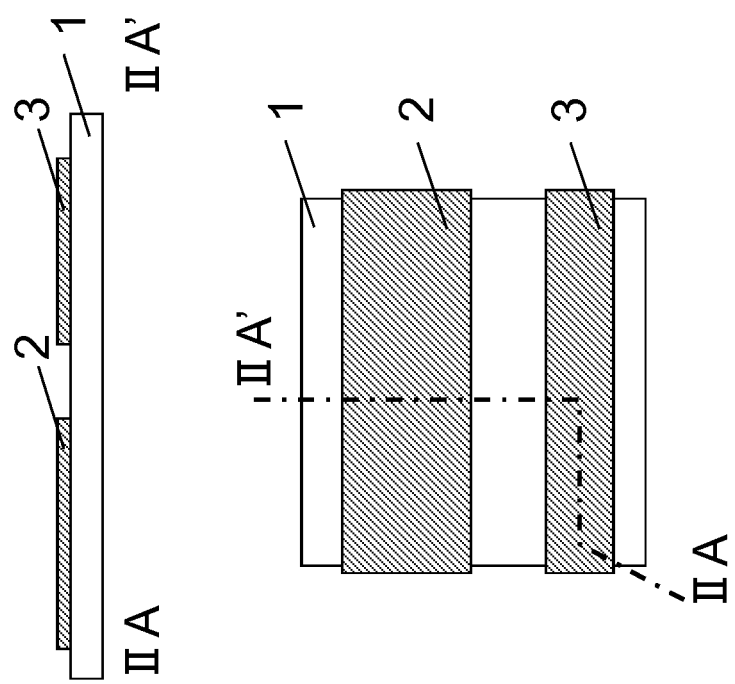
FIGS. 2A to 2D are schematic cross-sectional views and plan views illustrating manufacturing steps of an active matrix substrate according to a first embodiment of the present invention, wherein the schematic cross-sectional views (upper parts) are respectively taken along the lines IIA-IIA', IIB-IIB', IIC-IIC', and IID-IID' of the plan views (lower parts).

FIG. 2A is a schematic plan view in a stage where the gate and the capacitor are formed and a schematic cross-sectional view taken along the line IIA-IIA' of the plan view. In FIG. 2A, the source electrode and the source wire, and the capacitor electrode and the capacitor wire are respectively integrally formed in a stripe shape. Therefore, a thin film transistor array can be disposed on the gate and capacitor lines.

For the respective electrodes (the gate electrode, the source electrode, the drain electrode, the capacitor electrode, and the pixel electrode) and the respective wires according to the embodiment of the present invention, indium oxide ($In_2O_3$), tin oxide ($SnO_2$), zinc oxide (ZnO), cadmium oxide (CdO), indium cadmium oxide ($CdIn_2O_4$), cadmium tin oxide ($Cd_2SnO_4$), zinc tin oxide ($Zn_2SnO_4$), indium zinc oxide (In—Zn—O), may be used. In addition, materials obtained by doping impurities in the oxide materials are suitably used. For example, a material obtained by doping tin (Sn), molybdenum (Mo), or titanium (Ti) in the indium oxide, a material obtained by doping antimony (Sb) or fluorine (F) in tin oxide, a material obtained by doping indium, aluminum, and gallium (Ga) in zinc oxide, and the like may be used. Among them, particularly, indium tin oxide (a collective name, ITO) obtained by doping tin (Sn) in indium oxide has high transparency and low resistivity, and is thus suitably used. In addition, a multi-layer structure may be used in which the conductive oxide material and metal thin films such as gold (Au), silver (Ag), copper (Cu), cobalt (Co), tantalum (Ta), molybdenum (Mo), chrome (Cr), aluminum (Al), nickel (Ni), tungsten (W), platinum (Pt), and titanium (Ti), are plurally laminated. In this case, in order to prevent oxidation of the metal materials or deterioration with the passage of time, a three-layer structure where conductive oxide thin film/metal thin film/conductive oxide thin film are laminated in this order is particularly suitably used. In addition, the metal thin film layer is preferably as thin as possible such that light reflection or light absorption at the metal thin film layer does not hinder visibility of the display device. Specifically, the thickness thereof is preferably 1 nm or more to 20 nm or less. In addition, an organic conductive material such as PEDOT (polyethylenedioxythiophene) may be suitably used. In addition, if the transparency is not necessary, light blocking metals may be used. Specifically, metals such as the above-described gold (Au), silver (Ag), copper (Cu), cobalt (Co), tantalum (Ta), molybdenum (Mo), chrome (Cr), aluminum (Al), nickel (Ni), tungsten (W), platinum (Pt), and titanium (Ti) may be used. In addition, only a part of electrodes and wires may use non-transmissive materials. For example, in the image display device of the present invention, in a case where the gate and the source are formed in regions other than the display region, such as a black matrix region, a part of the electrodes and wires may be using light blocking metal materials.

The gate, the capacitor, the source, the drain, the pixel electrode may be formed using the same material or different materials. However, in order to reduce the number of manufacturing steps, it is more preferable that the gate and the capacitor, and the source and the drain be respectively formed using the same material. The wires and the electrodes may be formed using a vacuum deposition method, an ion plating method, a sputtering method, a laser ablation method, a plasma CVD (Chemical Vapor Deposition) method, an optical CVD method, a hot wire CVD method, a screen printing method, a letterpress printing, an ink jet method, or the like, but the present invention is not laminated thereto and well-known general methods may be used. Patterning is performed by forming a protective film at a pattern formation portion using, for example, a photolithography method and removing unnecessary portions through etching, but the present invention is not limited to the method, and well-known general patterning methods may be used.

Next, an insulating layer 4 is formed so as to cover the gate electrode 2. The insulating layer may be formed on the entire surface of the substrate. Materials for the gate insulating layer 4 according to the embodiment of the present invention are not particularly limited, and may include inorganic materials such as silicon oxide, silicon nitride, silicon oxynitride, aluminum oxide, tantalum oxide, yttrium oxide, hafnium oxide, hafnium aluminate, and zirconium oxide, titanium oxide, or, polyacrylate such as PMMA (polymethyl methacrylate), PVA (polyvinyl alcohol), PS (polystyrene), transparent polyimide, polyester, epoxy, polyvinyl phenol, polyvinyl alcohol, or the like, but the present invention is not limited thereto. In order to suppress gate leakage current, the resistivity of the insulating material is preferably $10^{11}$ Ωcm or more, and more preferably $10^{14}$ Ωcm or more. The gate insulating layer 4 is formed by appropriately using a dry film formation method such as a vacuum deposition method, an ion plating method, a sputtering method, a laser ablation method, a plasma CVD method, an optical CVD method, or a hot wire CVD method, or a wet film formation method such as a spin coating method, a deep coating method, or a screen printing method, depending on materials. The gate insulating layer 4 may use a single layer or two or more layers which are laminated. A composition may have gradient in a growth direction.

Figure 2B:
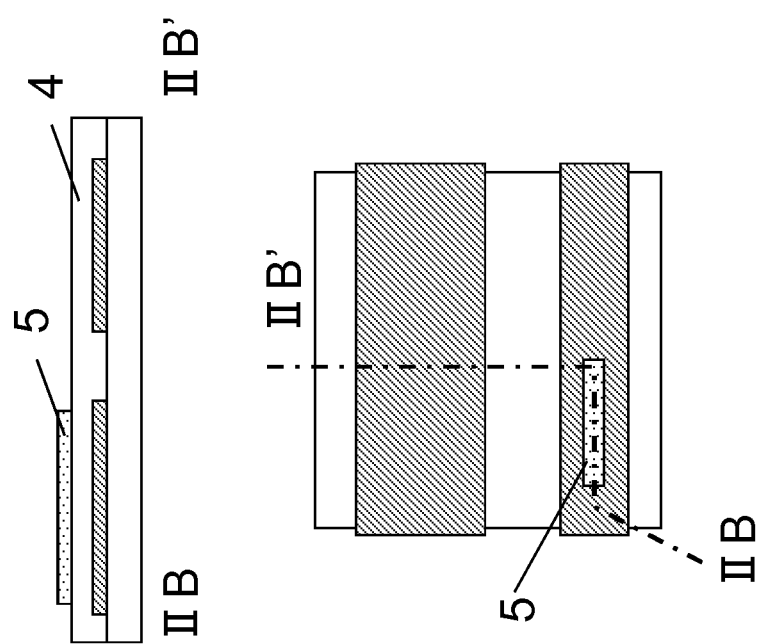

Next, as shown in FIG. 2B, a semiconductor active layer 5 is formed at a position which is rightly located over the gate electrode 2 on the insulating layer 4.

As the semiconductor active layer 5 according to the embodiment of the present invention, semiconductor oxide materials having a metal oxide as a main component may be used. The semiconductor oxide materials may include materials such as zinc oxide (ZnO), indium oxide (InO), indium zinc oxide (In—Zn—O), tin oxide (SnO), tungsten oxide (WO), indium gallium zinc oxide (In—Ga—Zn—O), and the like, which are oxides including or ore more kinds of elements of zinc (Zn), indium (In), tin (Sn), tungsten (W), magnesium (Mg), and gallium. The materials may have a mixed crystalline structure of a monocrystalline, polycrystalline, microcrystalline, or crystalline structure and an amorphous structure, a nanocrystal-distributed amorphous structure, or an amorphous structure. In addition, in a case where the semiconductor active layer is not required to have transparency, other inorganic materials may include silicon semiconductors such as hydrogenated amorphous silicon, microcrystalline silicon, polysilicon, and monosilicon. The semiconductor active layer is formed using these materials by methods such as a CVD method, a sputtering method, a pulse laser deposition method, a vacuum deposition method, and a sol-gel method. The CVD method may include a hot wire CVD method or a plasma CVD method, the sputtering method may include an RF magnetron sputtering method, a DC sputtering method, and the vacuum deposition method may include a heating deposition method, an electron beam deposition method, or an ion plating method, but the present invention is not limited thereto. In addition, in a case of forming the semiconductor active layer using an organic material, a low molecular weight organic semiconductor such as tetracene, pentacene, oligothiophene derivatives, phthalocyanines, or perylene derivatives, or high molecular weight organic semiconductor such as Polyfluorene, polyphenylene vinylene, or polytriarlamine may be used. The semiconductor active layer is formed using the material by a spin coating method, a deep coating method, a screen printing method, an ink jet method, or the like. In addition, the film thickness of the semiconductor active layer 5 is preferably 20 nm or more.

Figure 2C:
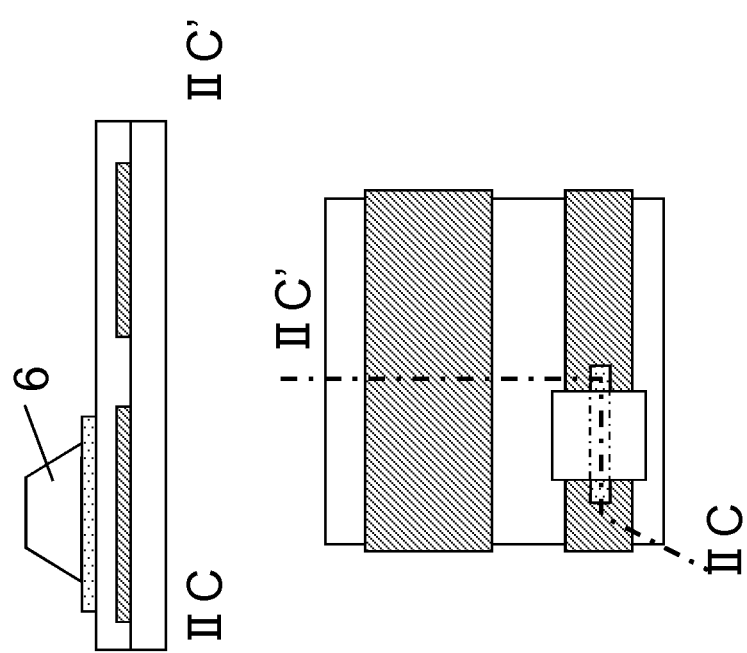

Next, as shown in FIG. 2C, a protective film 6 is formed. As shown in FIG. 1, the protective film 6 is formed in an island shape so as to protect the channel region of the semiconductor active layer 5, and covers a portion other than the contact portions with the source electrode 7 and the drain electrode 8 of the semiconductor active layer 5. Except that a part of the region where the protective film is exposed so as to divide the semiconductor active layer 5 into two regions, there is no particular limitation. As a shape of the protective film, the end portion located at least on the semiconductor active layer preferably has a forward tapered shape. Even in a film formation method where the linearity is high, the source electrode 7 and the drain electrode 8 can be formed on the protective film 6 without disconnection. In order to form the protective film 6 in a forward tapered shape, the tapered shape can be easily obtained using thermal reflow in a case of being made of a resin compound, and using proximity exposure in a case of being made of a photosensitive material. In addition, in a case where the protective film 6 is made of an inorganic material, an angle of the tapered shape can be controlled by controlling an etching condition through a method such as a reactive ion etching (RIE).

The protective film 6 according to the embodiment of the present invention may use inorganic materials such as silicon oxide, silicon nitride, silicon oxynitride, aluminum oxide, tantalum oxide, yttrium oxide, hafnium oxide, hafnium aluminate, and zirconium oxide, titanium oxide, or, polyacrylate such as PMMA (polymethyl methacrylate), PVA (polyvinyl alcohol), PS (polystyrene), transparent polyimide, polyester, epoxy, polyvinyl phenol, polyvinyl alcohol, or the like, but the present invention is not limited thereto. In order to prevent the protective film 6 from exerting electrical influence on the semiconductor active layer of the thin film transistor related to the present invention, the resistivity thereof is preferably $10^{11}$ Ωcm or more, particularly, $10^{14}$ Ωcm or more. The protective film 6 is formed by appropriately using a dry film formation method such as a vacuum deposition method, an ion plating method, a sputtering method, a laser ablation method, a plasma CVD method, an optical CVD method, or a hot wire CVD method, or a wet film formation method such as a spin coating method, a deep coating method, or a screen printing method, depending on materials. The protective film 6 may use two or more layers which are laminated, and may use a mixture of the inorganic insulating material with the organic insulating material.

The protective film 6 functions as an etching stopper, and after the protective film 6 is patterned, a plasma treatment is performed only for the contact portions with the source electrode 7 and the drain electrode 8 while protecting the channel region of the semiconductor active layer 5. Thereby, it is possible to improve conductivity of the contact portions with the source electrode 7 and the drain electrode 8 of the semiconductor active layer 5 exposed from the protective film 6, and thus it is possible to reduce contact resistance between the semiconductor active layer 5 and the source electrode 7 and the drain electrode 8.

In addition, as shown in FIG. 5, the protective film may have a multi-layer structure. In this case, by using the upper protective film 6a as an etching stopper or a resist, the lower protective film 6b can be easily patterned. Specifically, first, the protective film 6b is formed on the entire substrate. Then, the protective film 6a is patterned and formed on the semiconductor active layer. When the protective film 6a is patterned, the presence of the protective film 6b can prevent the semiconductor active layer from being deteriorated due to a developing solution in the photolithography process or etching. Next, a region of the protective film 6b which is not covered by the protective film 6a is removed using the protective film 6a as an etching stopper or a resist.

The protective film having the multi-layer structure can be easily formed through the above-described steps. Of course, the protective film 6b may be formed of multiple layers so as to become a multi-layer protective film 6b. Particularly, in a case of using a metal oxide for the semiconductor active layer 5, semiconductor characteristics are greatly dependent on a composition of the protective film covering the surface, but the protective film is formed to be divided into the upper protective film 6a and the lower protective film 6b coming into contact with the semiconductor active layer 5, thereby a degree of freedom for a formation method of the upper protective film or for a material is increased, and thus characteristics of the semiconductor active layer can be maintained and improved by the lower protective film 6b. Examples of the lower protective film 6b may use metal oxide insulating materials such as silicon oxide, silicon nitride, silicon oxynitride, aluminum oxide, tantalum oxide, yttrium oxide, and hafnium oxide. By controlling an oxygen partial pressure when a film is formed using the materials, oxygen concentration is adjusted in the film, and carrier concentration of the semiconductor active layer is varied, thereby improving TFT characteristics.

Figure 2D:
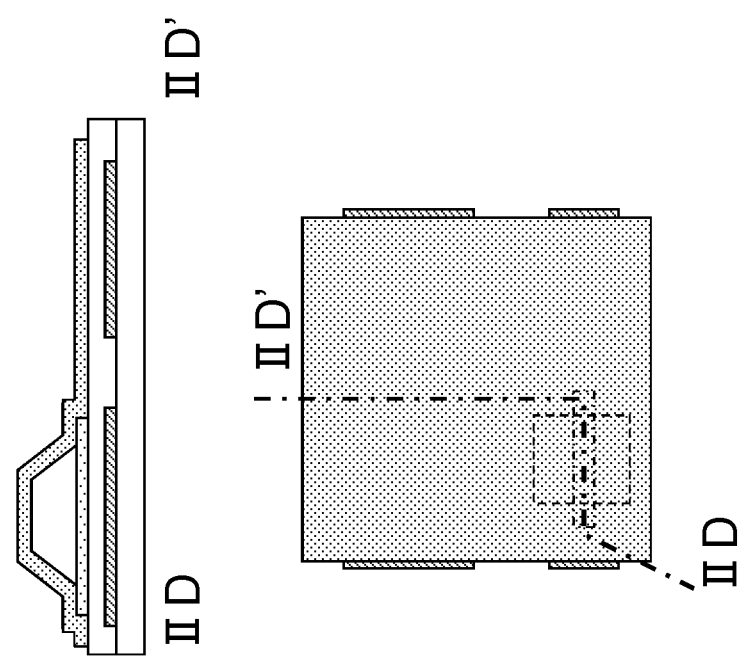
Figure 3A:
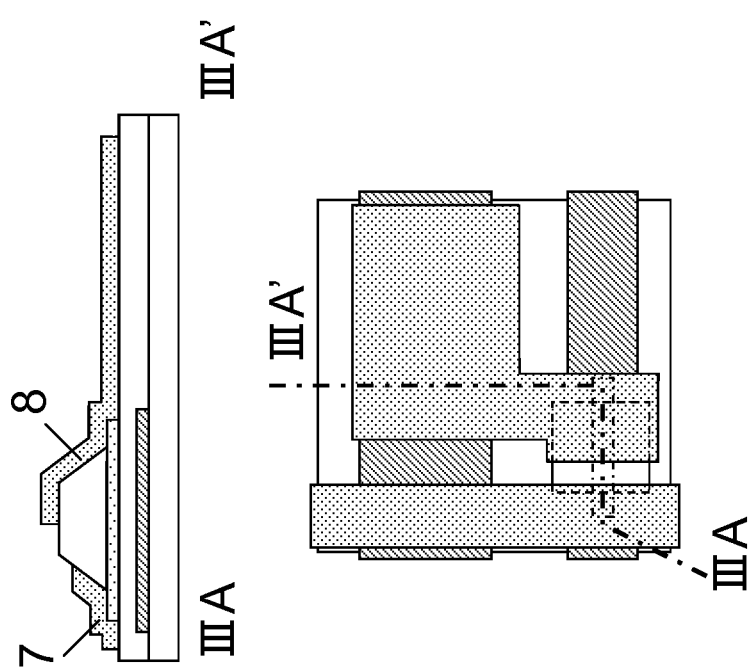

Next, the source and the drain are formed. First, as shown in FIG. 2D, a conductive material as a material of the wires and the electrodes is formed on the entire substrate and covers the entire substrate including the protective film 6. In addition, patterning is performed such that the source electrode and the drain electrode cover two exposed surfaces of the semiconductor active layer 5 and are electrically connected thereto. At this time, the drain electrode connected to a pixel electrode is preferably patterned so as to hang on the top portion of the protective film 6 (FIG. 3A). If the drain electrode is patterned so as to hang on the top portion of the protective film 6, the drain electrode can be connected to the pixel electrode at the highest portion of the protective film. Materials and formation methods of the source and drain are the same as described above. In FIG. 3A, the source electrode and the source wire are integrally formed in a stripe shape. In addition, the drain electrode has the pixel electrode connection portion on the protective film 6 as described above, and is formed in such a shape where the drain electrode is located rightly over the capacitor electrode.

Next, an interlayer insulating layer for insulating the source electrode and the pixel electrode is formed on the substrate provided with the source and the drain (FIG. 3B).

The interlayer insulating layer 9 according to the embodiment of the present invention may use inorganic materials such as silicon oxide, silicon nitride, silicon oxynitride, aluminum oxide, tantalum oxide, yttrium oxide, hafnium oxide, hafnium aluminate, and zirconium oxide, titanium oxide, or, polyacrylate such as PMMA (polymethyl methacrylate), PVA (polyvinyl alcohol), PS (polystyrene), transparent polyimide, polyester, epoxy, polyvinyl phenol, polyvinyl alcohol, or the like, but the present invention is not limited thereto. In order to insulate the source electrode 7 from the pixel electrode 10, the resistivity of the interlayer insulating layer 9 is preferably $10^{11}$ Ωcm or more, and more preferably $10^{14}$ Ωcm or more. The interlayer insulating layer 9 is formed by appropriately using a dry film formation method such as a vacuum deposition method, an ion plating method, a sputtering method, a laser ablation method, a plasma CVD method, an optical CVD method, or a hot wire CVD method, or a wet film formation method such as a spin coating method, a deep coating method, or a screen printing method, depending on materials. The interlayer insulating layer 9 may use two or more layers which are laminated. A composition may have gradient in a growth direction.

The interlayer insulating layer 9 has an opening portion on the protective film 6, and thus the drain electrode 8 can be connected to the pixel electrode 10 on the protective film. The opening portion is provided using a well-known method such as a photolithography method or etching when or after the protective film is formed. In addition, color filter materials including pigments or dyes such as, for example, red, green, and blue may be used in the interlayer insulating layer 9. When the color filter materials are used in the interlayer insulating layer 9, it is possible to manufacture a COA substrate where a color filter is formed on the thin film transistor. In the COA substrate, since position alignment between the thin film transistor and the color filter is easy, and position alignment errors are made to be small, it is expected to improve an aperture ratio or a yield.

Finally, a film is formed on the interlayer insulating layer 9 using a conductive material and is patterned into a predetermined pixel shape so as to form the pixel electrode 10, thereby forming the active matrix substrate of the present invention.

Figure 3C:
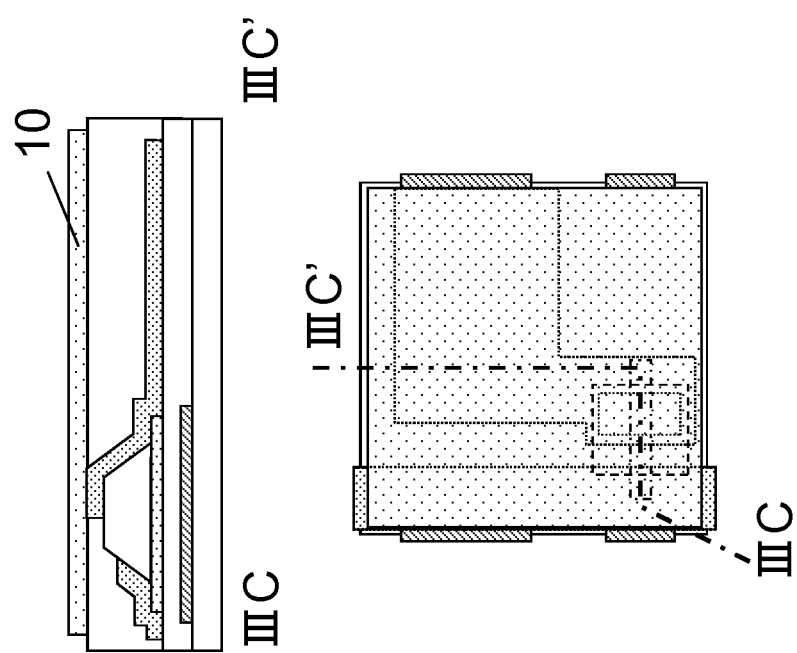
Figure 4A:
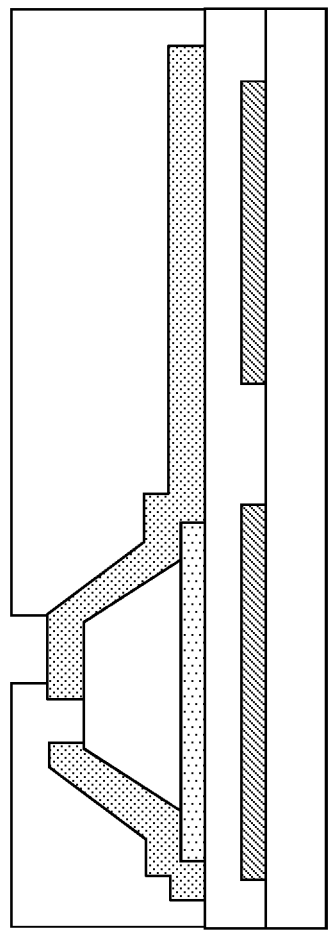
FIGS. 4A and 4B are schematic cross-sectional views illustrating another example of the manufacturing steps of the active matrix substrate of the present invention.
Figure 4B:
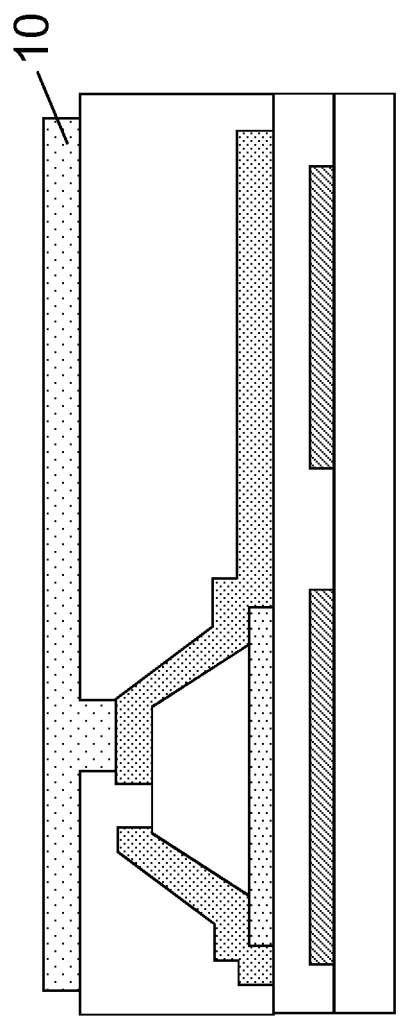

In FIG. 3C, the height of the drain electrode 8 formed at the top portion of the protective film 6 corresponds with the surface of the interlayer insulating layer, but the present invention is not limited thereto. For example, in a case where the height of the top portion of the protective film 6 is smaller than the surface of the interlayer insulating layer, as shown in FIGS. 4A and 4B, an opening portion is formed in the interlayer insulating layer, and the pixel electrode is formed thereon, thereby electrically connecting the drain electrode to the pixel electrode (FIG. 4B). On the other hand, in a case where the height of the top portion of the protective film 6 is the same or larger than the surface of the interlayer insulating layer, the drain electrode is projected upward from the interlayer insulating layer, electrical connection becomes easy. Any case is possible in a range where the drain electrode is electrically connected to the pixel electrode, the source electrode is insulated by being covered by the interlayer insulating layer, and thereby the display element 11 is not hindered.

The image display element 11 and the opposite electrode 12 are laminated on the active matrix substrate of the present invention created in this way, thereby manufacturing the image display device as shown in FIGS. 1 and 5. Examples of the image display device may include an electrophoretic display medium (electronic paper), a liquid crystal display medium, an organic EL, an inorganic EL, and the like. As a laminating method, a method where the active matrix substrate of the present invention is joined to the laminate of the opposite substrate 13, the opposite electrode, and the image display element, a method where the image display element, the opposite electrode, and the opposite substrate are sequentially laminated on the active matrix substrate of the present invention, or the like may be appropriately selected depending on the kind of image display element.

Next, a second embodiment of the present invention will be described.

Figure 8A:
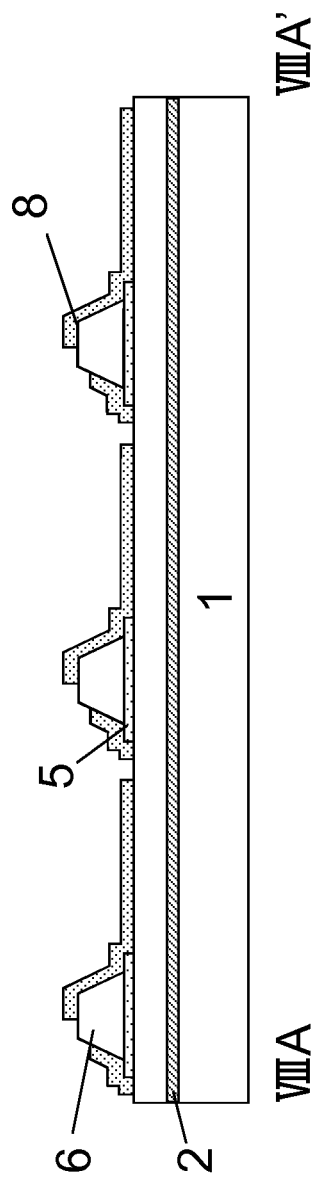
FIGS. 8A and 8B are respectively a schematic cross-sectional view and a plan view illustrating an active matrix substrate according to a second embodiment of the present invention, wherein the schematic cross-sectional view of FIG. 8A is taken along the line VIIIB-VIIIB' of the plan view of FIG. 8B.
Figure 8B:
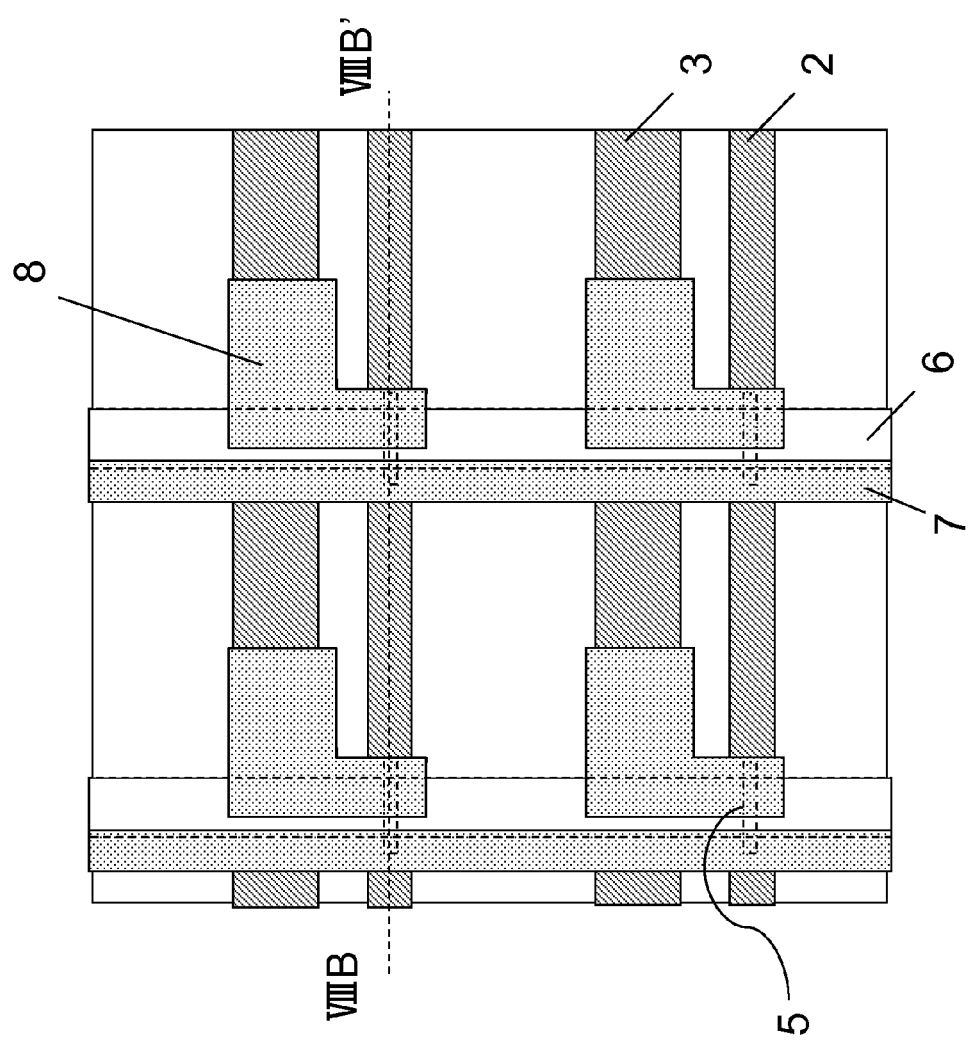

FIGS. 8A and 8B are a plan view and a schematic cross-sectional view illustrating a configuration example of the TFT array of the active matrix substrate of the present invention. However, the pixel electrode and the interlayer insulating layer are not shown. In the active matrix substrate of the present invention, the protective film 6 is formed in a stripe shape. As described above, since the protective film is disposed so as to pass over the semiconductor active layer 5, a single protective film 6 in a stripe shape is formed so as to divide the independent semiconductor active layer constituting each TFT of a column of the TFT array formed in a straight line shape into two regions, and thereby the protective film can be also used as protective films of all the TFTs of the column of the TFT array. In an example of the active matrix substrate according to the second embodiment shown in FIGS. 8A and 8B, the gate electrode 2, the capacitor electrode 3, and the source electrode 7 are also formed in a stripe shape without differentiation of electrode regions and wire regions.

In the second embodiment as well, using the same materials as in the first embodiment, if the substrate and predetermined constituent elements of the thin film transistor in the active matrix substrate 101 are made to be substantially transparent, it is possible to realize image display with a configuration where the display element 11 is viewed from the active matrix substrate side. In this case, the respective wires, electrodes, and the gate insulating layers of the active matrix substrate are substantially transparent. The semiconductor active layer is preferably formed of a metal oxide semiconductor which can be substantially transparent. In addition, even in a case of partially using a material which is not transmissive, each constituent element in the display region of the display device is preferably substantially transparent. Here, the term "substantially transparent" means that the transmittance is 70% or more in a range of the wavelength region of 400 nm or more to 700 nm or less which is visible light. Here, if a pigmented layer is formed at the interlayer insulating layer which is then used as color filter, it gives an active matrix substrate of the COA structure.

Hereinafter, each constituent element of the second embodiment of the present invention will be described in detail according to manufacturing steps of the active matrix substrate.

The substrate 1 according to the embodiment of the present invention may use the same materials as in the first embodiment.

Figure 9A:
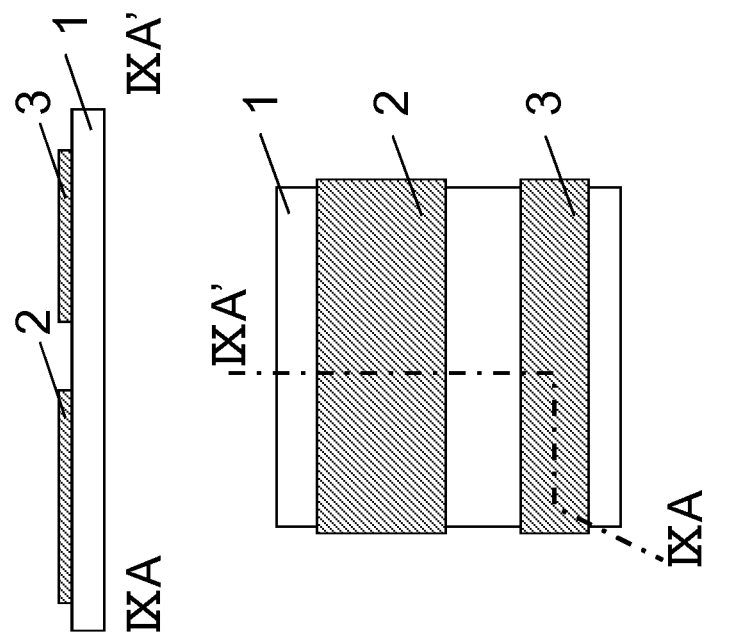
FIGS. 9A to 9D are schematic cross-sectional views and plan views illustrating manufacturing steps of an active matrix substrate according to the second embodiment of the present invention, wherein the schematic cross-sectional views (upper parts) are respectively taken along the lines IXA-IXA', IXB-IXB', IXC-IXC', and IXD-IXD' of the plan views (lower parts).

FIG. 9A is a schematic plan view in a stage where a gate and a capacitor are formed and a schematic cross-sectional view taken along the line IXA-IXA' of the plan view. In FIG. 9A, the source electrode and the source wire, and the capacitor electrode and the capacitor wire are respectively integrally formed in a stripe shape. Therefore, a thin film transistor array can be disposed on the gate and capacitor lines.

The respective electrodes (the gate electrode, the source electrode, the drain electrode, the capacitor electrode, and the pixel electrode) and the respective wires according to the second embodiment of the present invention may be formed using the same materials and formation methods as in the first embodiment.

Figure 9B:
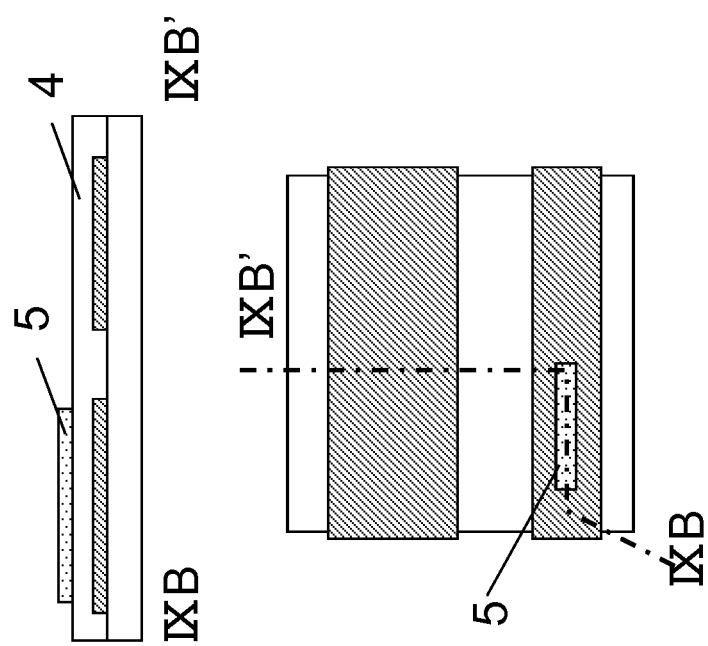

Next, as shown in FIG. 9B, a semiconductor active layer 5 is formed at a position which is directly located over the gate electrode 2 on the insulating layer 4.

The semiconductor active layer 5 according to the second embodiment of the present invention may be formed using the same materials and formation methods as in the first embodiment.

Figure 9C:
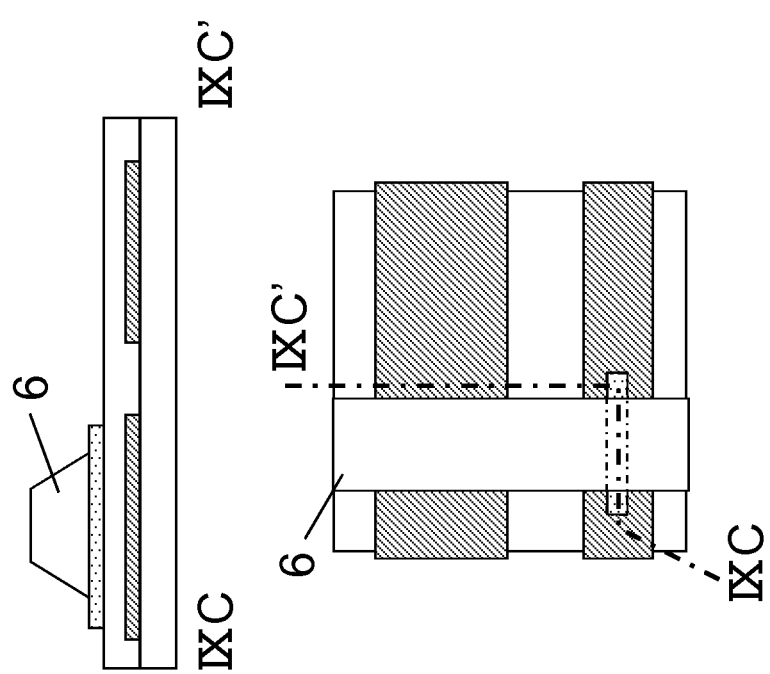

Next, as shown in FIG. 9C, a protective film 6 is formed. As shown in FIG. 1, the protective film 6 is formed so as to protect the channel region of the semiconductor active layer 5, and covers a portion other than the contact portions with the source electrode 7 and the drain electrode 8. Therefore, in a case where the semiconductor active layer has a rectangular shape having a long side so as to be perpendicular in the stripe direction, the width of the protective film formed in a stripe shape is smaller than the length of the long side of the semiconductor active layer. As a shape of the protective film, the end portion of the stripe edge preferably has a forward tapered shape. Even in a film formation method where the linearity is high, the source electrode 7 and the drain electrode 8 can be formed on the protective film 6 without disconnection. In order to form the protective film 6 in a forward tapered shape, the tapered shape can be easily obtained using thermal reflow in a case of being made of a resin compound, and using proximity exposure in a case of being made of a photosensitive material. In addition, in a case where the protective film 6 is made of an inorganic material, an angle of the tapered shape can be controlled by controlling an etching condition through a method such as a reactive ion etching (RIE).

The protective film 6 according to the second embodiment of the present invention may use inorganic materials such as silicon oxide, silicon nitride, silicon oxynitride, aluminum oxide, tantalum oxide, yttrium oxide, hafnium oxide, hafnium aluminate, and zirconium oxide, titanium oxide, or, polyacrylate such as PMMA (polymethyl methacrylate), PVA (polyvinyl alcohol), PS (polystyrene), transparent polyimide, polyester, epoxy, polyvinyl phenol, polyvinyl alcohol, or the like, but the present invention is not limited thereto. In order to prevent the protective film 6 from exerting electrical influence on the semiconductor active layer of the thin film transistor related to the present invention, the resistivity thereof is preferably $10^{11}$ Ωcm or more, particularly, $10^{14}$ Ωcm or more. The protective film 6 is formed by appropriately using a dry film formation method such as a vacuum deposition method, an ion plating method, a sputtering method, a laser ablation method, a plasma CVD method, an optical CVD method, or a hot wire CVD method, or a wet film formation method such as a spin coating method, a deep coating method, or a screen printing method, depending on materials. The protective film 6 may use two or more layers which are laminated, and may use a mixture of the inorganic insulating material with the organic insulating material.

Since accurate position alignment in the stripe direction is not necessary by forming the protective film 6 in a stripe shape, position misalignment to be noted during alignment is suppressed in one direction, thus position alignment accuracy is improved, and thereby the active matrix substrate can be manufacture with a high yield. Particularly, in a case of using a printing method such as screen printing by using an organic insulating film as the protective film 6, if the protective film is formed in a small isolated pattern of a dot state, position misalignment due to ejection defect or transfer defect caused by clogging of the printing plate occurs in both directions of X axis direction and Y axis direction when the active matrix substrate is viewed from the top in a two-dimensional manner, and thus it is difficult to secure accuracy of the position alignment. Therefore, the protective film 6 is preferably formed in a stripe shape.

The protective film 6 functions as an etching stopper, and after the protective film 6 is patterned, a plasma treatment is performed only for the contact portions with the source electrode 7 and the drain electrode 8 while protecting the channel region of the semiconductor active layer 5. Thereby, it is possible to improve conductivity of the contact portions with the source electrode 7 and the drain electrode 8 of the semiconductor active layer 5 exposed from the protective film 6, and thus it is possible to reduce contact resistance between the semiconductor active layer 5 and the source electrode 7 and the drain electrode 8.

In addition, as shown in FIG. 5, the protective film may have a multi-layer structure, and, in the second embodiment, a stripe-shaped protective film 6b is formed at the lower part of a stripe-shaped protective film 6a. In this case as well, the protective films may be formed in the same manner as the first embodiment.

Figure 9D:
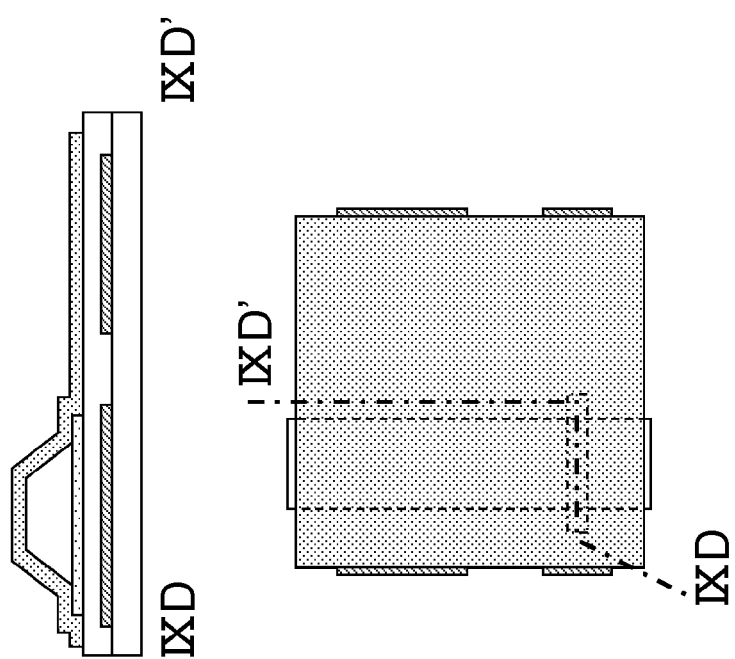
Figure 10A:
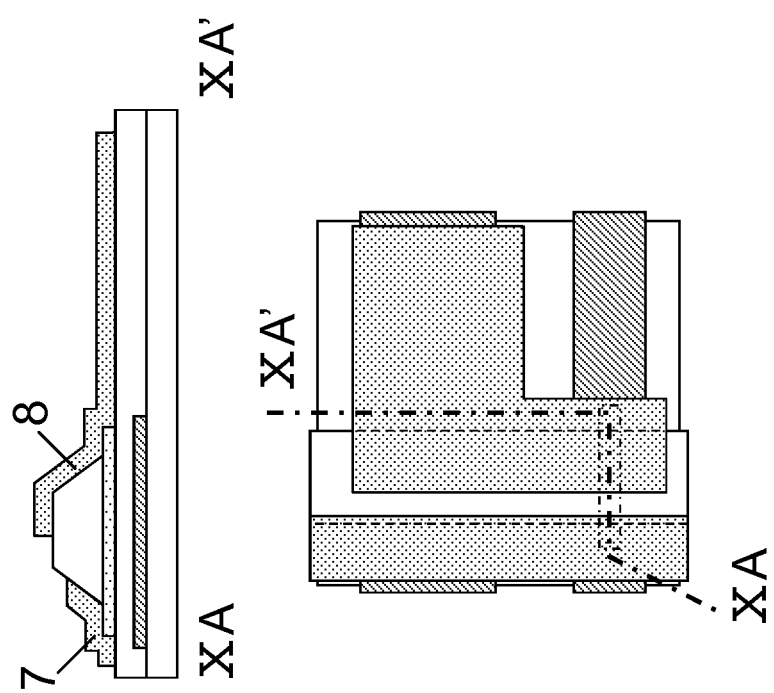
FIGS. 10A to 10C are schematic cross-sectional views and plan views illustrating manufacturing steps of the active matrix substrate according to the second embodiment of the present invention, wherein the schematic cross-sectional views (upper parts) are respectively taken along the lines XA-XA', XB-XB', and XC-XC' of the plan views (lower parts).

Next, the source and the drain are formed. First, as shown in FIG. 9D, a conductive material as a material of the wires and the electrodes is formed on the entire substrate and covers the entire substrate including the protective film 6. In addition, patterning is performed such that the source electrode 7 and the drain electrode 8 cover two exposed surfaces of the semiconductor active layer 5 and are electrically connected thereto. At this time, the drain electrode connected to a pixel electrode is preferably patterned so as to hang on the top portion of the protective film 6 (FIG. 10A). Materials and formation methods of the source and drain are the same as described above. In FIG. 10A, the source electrode and the source wire are integrally formed in a stripe shape. In addition, the drain electrode has the pixel electrode connection portion on the protective film 6 as described above, and is formed in such a shape where the drain electrode is located rightly over the capacitor electrode.

Figure 10B:
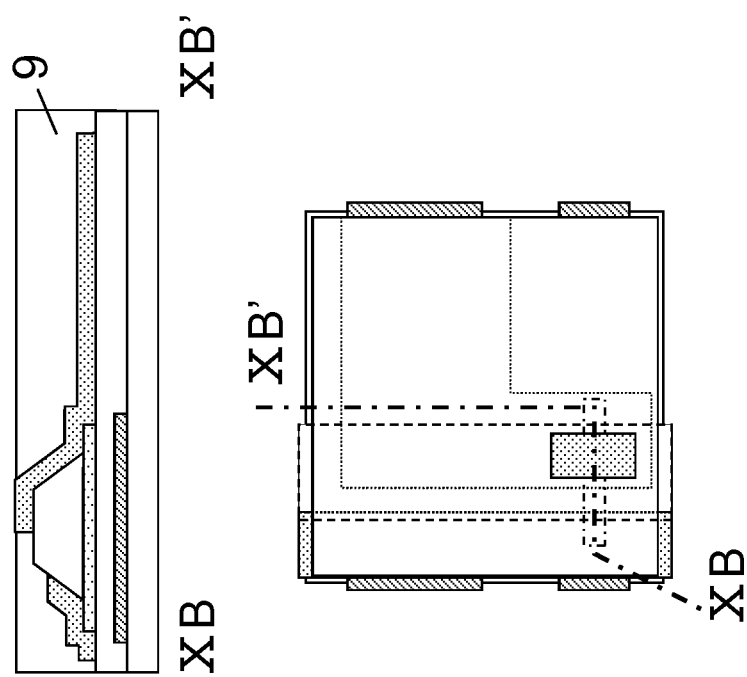
Figure 10C:
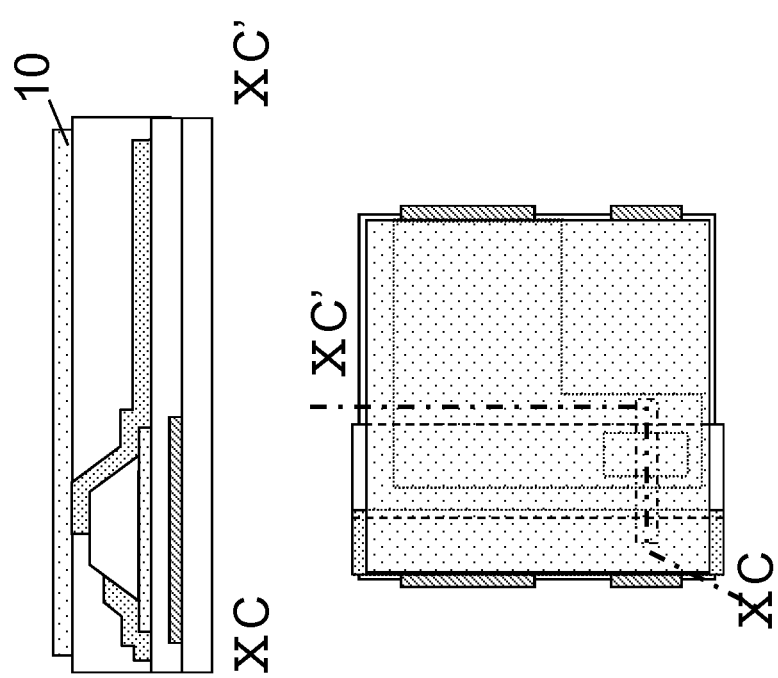

Next, an interlayer insulating layer 9 for insulating the source electrode and the pixel electrode is formed on the substrate provided with the source and the drain (FIG. 10B).

The interlayer insulating layer 9 according to the second embodiment of the present invention may be formed in the same manner as the first embodiment.

Figure 11B:
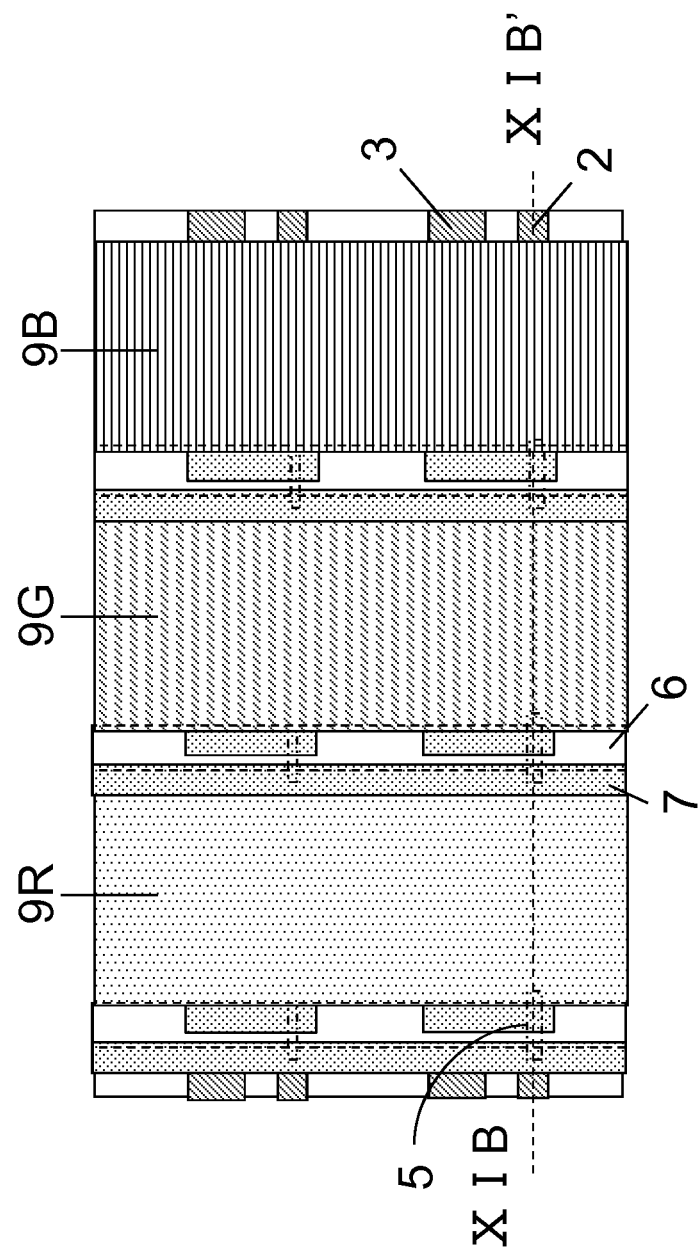
Figure 13A:
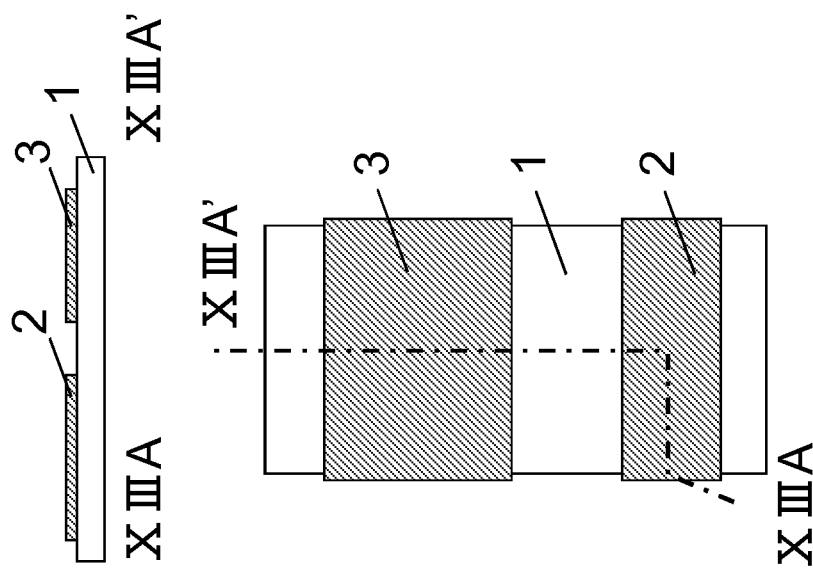
FIGS. 13A to 13D are schematic cross-sectional views and plan views illustrating manufacturing steps of the active matrix substrate according to the third embodiment of the present invention, wherein the schematic cross-sectional views (upper parts) are respectively taken along the lines XIIIA-XIIIA', XIIIB-XIIIB', XIIIC-XIIIC', and XIIID-XIIID' of the plan views (lower parts).
Figure 13B:
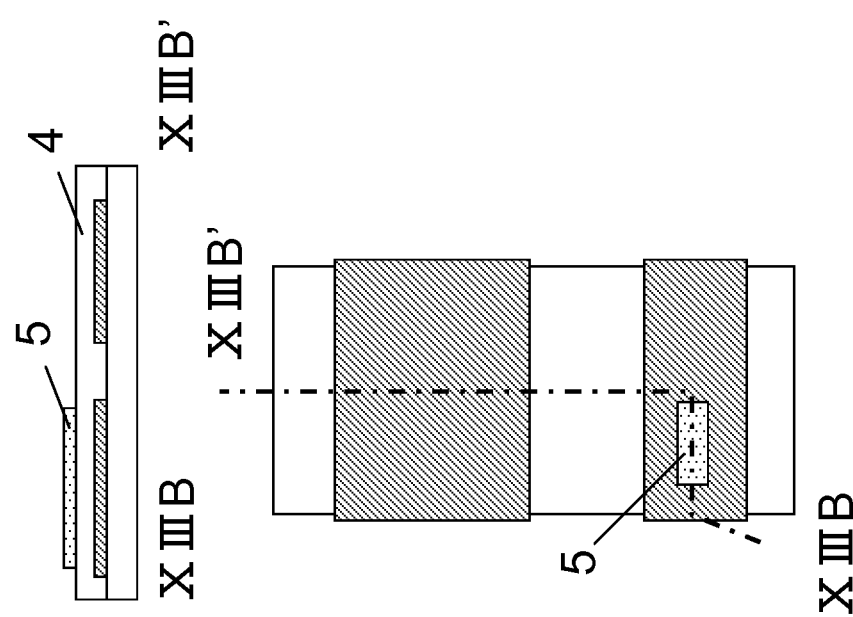

The interlayer insulating layer 9 has an opening portion on the protective film 6, and thus the drain electrode 8 can be connected to the pixel electrode 10 on the protective film. The opening portion is provided using a well-known method such as a photolithography method or etching when or after the protective film is formed. In addition, color filter materials including pigments or dyes such as, for example, red, green, and blue may be used in the interlayer insulating layer 9. When the color filter materials are used in the interlayer insulating layer 9, it is possible to manufacture a COA substrate where a color filter is formed on the thin film transistor. In the COA substrate, since position alignment between the thin film transistor and the color filter is easy, and position alignment errors are made to be small, it is expected to improve an aperture ratio or a yield. FIG. 11B is a configuration example of the active matrix substrate where the interlayer insulating layers are arranged as pigmented layers of the respective colors (for example, red (R), green (G), and blue (B)) and are used as color filter layers. Here, the pixel electrode 10 is not shown. FIG. 11A is a cross-sectional view taken along the line XIB-XIB' of FIG. 11B. As shown in FIGS. 13A to 13B, in a case of forming the pigmented layers in a stripe shape, the protective film 6 may be used a separator (barrier) of the pigmented layers. Therefore, particularly, in a case where the respective pigmented layers are formed to be applied and separated, by using a variety of printing methods, it is possible to form the layers without color mixing.

Finally, a film is formed on the interlayer insulating layer 9 using a conductive material and is patterned into a predetermined pixel shape so as to form the pixel electrode 10, thereby forming the active matrix substrate of the present invention. In FIGS. 11A and 11B, the height of the drain electrode 8 formed on the top portion of the protective film 6 corresponds with the surface of the interlayer insulating layer, but the present invention is not limited thereto. For example, in a case where the height of the top portion of the protective film 6 is smaller than the surface of the interlayer insulating layer, as shown in FIGS. 4A and 4B, an opening portion is formed in the interlayer insulating layer, and the pixel electrode is formed thereon, thereby electrically connecting the drain electrode to the pixel electrode (FIG. 4B). On the other hand, in a case where the height of the top portion of the protective film 6 is the same or larger than the surface of the interlayer insulating layer, the drain electrode is projected upward from the interlayer insulating layer, electrical connection becomes easy. Any case is possible in a range where the drain electrode is electrically connected to the pixel electrode, the source electrode is insulated by being covered by the interlayer insulating layer, and thereby the display element 11 is not hindered.

The image display element 11 and the opposite electrode 12 are laminated on the active matrix substrate of the present invention created in this way, thereby manufacturing the image display device as shown in FIGS. 8A and 8B. Examples of the image display element may include an electrophoretic display medium (electronic paper), a liquid crystal display medium, an organic EL, an inorganic EL, and the like. As a laminating method, a method where the active matrix substrate of the present invention is joined to the laminate of the opposite substrate 13, the opposite electrode, and the image display element, a method where the image display element, the opposite electrode, and the opposite substrate are sequentially laminated on the active matrix substrate of the present invention, or the like may be appropriately selected depending on the kind of image display element.

Next, a third embodiment of the present invention will be described.

Figure 12A:
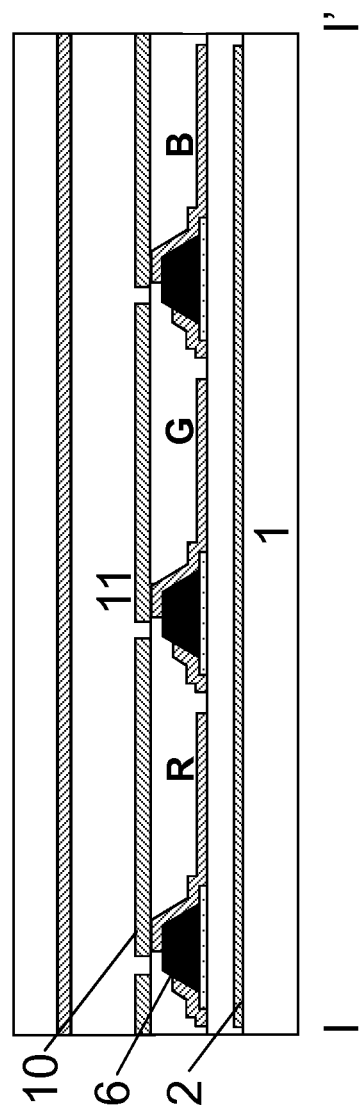
Figure 12B:
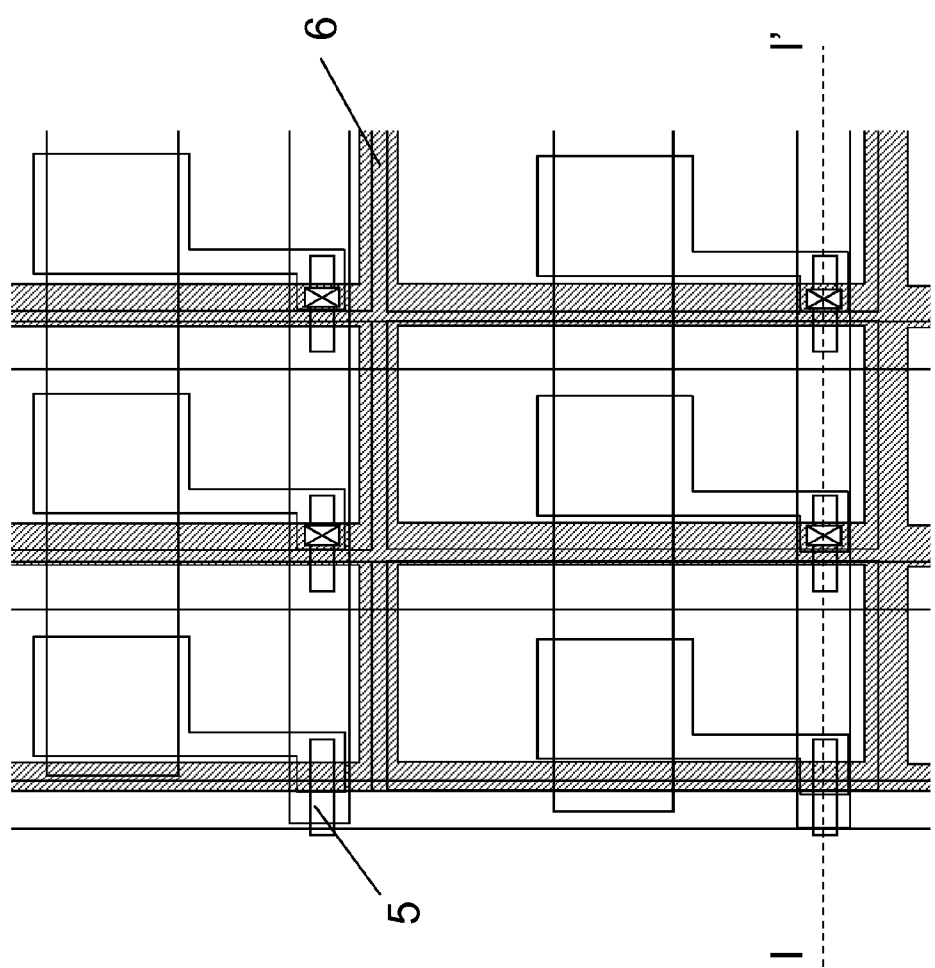

FIGS. 12A and 12B are a plan view and a schematic cross-sectional view illustrating a configuration example of the TFT array of the active matrix substrate of the present invention. However, the pixel electrode and the interlayer insulating layer are not shown. In the active matrix substrate of the present invention, the protective film 6 forms a black matrix so as to partition the respective pixels. As described above, since the protective film is disposed so as to pass over the semiconductor active layer 5, the thin film transistor is formed at least at one side of the protective film formed in a lattice shape. The protective film 6 in a lattice shape is formed so as to divide the independent semiconductor active layer constituting each TFT of the TFT array into two regions, further the protective film has a light blocking property, and thereby the protective film can be also used as protective films and black matrices of all the TFTs of the column of the TFT array. In an example of the active matrix substrate according to the third embodiment shown in FIGS. 12A and 12B, the gate 2, the capacitor 3, and the source electrode 7 are also formed in a stripe shape without differentiation of electrode regions and wire regions.

In the third embodiment as well, as in the first embodiment, if the substrate and predetermined constituent elements of the thin film transistor in the active matrix substrate 101 are made to be substantially transparent, it is possible to realize image display with a configuration where the display element 11 is viewed from the active matrix substrate side. In this case, the respective wires, electrodes, and the gate insulating layers of the active matrix substrate are substantially transparent. The semiconductor active layer is preferably formed of a metal oxide semiconductor which can be substantially transparent. In addition, even in a case of partially using a material which is not transmissive, each constituent element in the display region of the display device is preferably substantially transparent. Here, the term "substantially transparent" means that the transmittance is 70% or more in a range of the wavelength region of 400 nm or more to 700 nm or less which is visible light. Here, if a pigmented layer is formed at the interlayer insulating layer which is then used as color filter, it gives an active matrix substrate of the COA structure.

FIG. 12A is a cross-sectional view taken along the line XIIA-XIIA' of the active matrix substrate of FIG. 12B. Since the pixels are partitioned by the protective film 6, pigmented layers of the respective colors (for example, red (R), green (G), and blue (B)) are formed for the respective partitioned regions, and it gives an active matrix substrate of a COA structure where the interlayer insulating layer is also used as color filter layer.

Hereinafter, each constituent element of the third embodiment of the present invention will be described in detail according to manufacturing steps of the active matrix substrate.

The substrate 1 according to the embodiment of the present invention may use the same materials as in the first embodiment.

FIG. 13A is a schematic plan view in a stage where a gate and a capacitor are formed and a schematic cross-sectional view taken along the line XIIIA-XIIIA' of the plan view. In FIG. 13A, the source electrode and the source wire, and the capacitor electrode and the capacitor wire are respectively integrally formed in a stripe shape. Therefore, a thin film transistor array can be disposed on the gate and capacitor lines.

The respective electrodes (the gate electrode, the source electrode, the drain electrode, the capacitor electrode, and the pixel electrode) and the respective wires according to the third embodiment of the present invention may be formed using the same materials and formation methods as in the first embodiment.

Next, as shown in FIG. 13B, a semiconductor active layer 5 is formed at a position which is rightly located over the gate electrode 2 on the insulating layer 4.

The semiconductor active layer 5 according to the third embodiment of the present invention may be formed using the same materials and formation methods as in the first embodiment.

Figure 13C:
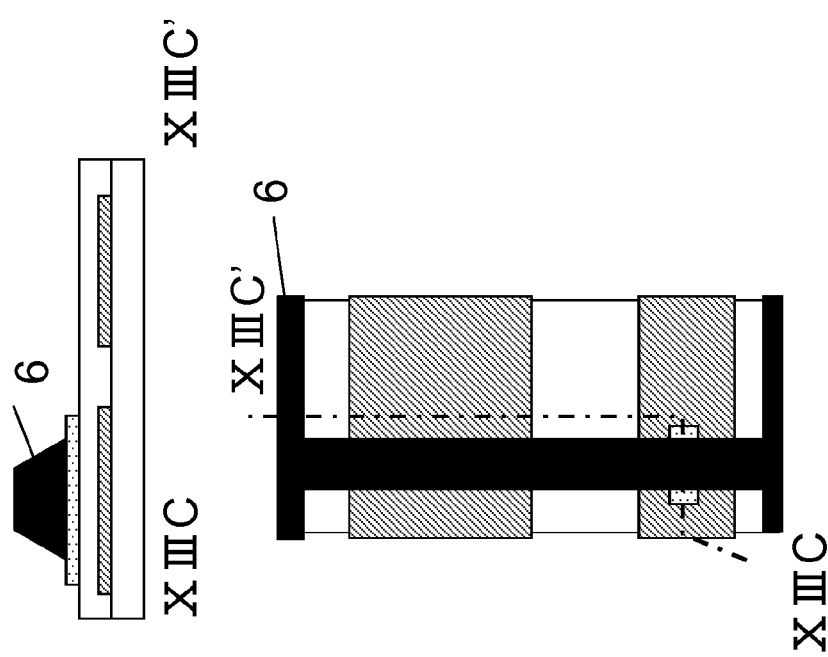

Next, as shown in FIG. 13C, a protective film 6 is formed. As shown in FIG. 1, the protective film 6 is formed so as to protect the channel region of the semiconductor active layer 5, and covers a portion other than the contact portions with the source electrode 7 and the drain electrode 8 of the semiconductor active layer 5. In addition, as shown in FIGS. 12A and 12B, the protective film 6 is formed in a lattice shape at the plane on the substrate. Therefore, in a case where the semiconductor active layer has a rectangular shape having a long side so as to be perpendicular to the side direction of the lattice shape of the protective film formed on the semiconductor active layer, the side width of the formed protective film is smaller than the length of the long side of the semiconductor active layer. As a shape of the protective film, the end portion of the stripe edge that is formed on the semiconductor active layer preferably has a forward tapered shape. Even in a film formation method where the linearity is high, the source electrode 7 and the drain electrode 8 can be formed on the protective film 6 without disconnection. In order to form the protective film 6 in a forward tapered shape, the tapered shape can be easily obtained using thermal reflow in a case of being made of a resin compound, and using proximity exposure in a case of being made of a photosensitive material. In addition, in a case where the protective film 6 is made of an inorganic material, an angle of the tapered shape can be controlled by controlling an etching condition through a method such as a reactive ion etching (RIE).

The protective film 6 according to the third embodiment of the present invention may use chrome (Cr), chrome oxide (CrOx), tantalum silicide (TaSi), tantalum silicon nitride (TaSiN), tantalum silicon nitride oxide (TaSiNO), zirconium silicide (ZrSi), zirconium silicon nitride (ZrSiN), carbon black-dispersed resin, and the like, as light blocking materials. In relation to a light blocking property of the protective film as a black matrix, the transmittance in a range of the wavelength region of 350 nm or more to 700 nm or less which is a near-ultraviolet and visible light region is preferably 1% or less, that is, an optical density (OD value) is two or more, and, more preferably, the transmittance is 0.1% or less, that is, the OD value is 3 or more. In addition, as described later, in a case of multiple layers, it is not necessary to use the light blocking materials for all the layers, and materials thereof may include inorganic materials such as silicon oxide, silicon nitride, silicon oxynitride, aluminum oxide, tantalum oxide, yttrium oxide, hafnium oxide, hafnium aluminate, and zirconium oxide, titanium oxide, or, polyacrylate such as PMMA (polymethyl methacrylate), PVA (polyvinyl alcohol), PS (polystyrene), transparent polyimide, polyester, epoxy, polyvinyl phenol, polyvinyl alcohol, or the like, but the present invention is not limited thereto.

In order to prevent the protective film 6 from exerting electrical influence on the semiconductor active layer of the thin film transistor related to the present invention, the resistivity thereof is preferably $10^{11}$ Ωcm or more, particularly, $10^{14}$ Ωcm or more. The protective film 6 is formed by appropriately using a dry film formation method such as a vacuum deposition method, an ion plating method, a sputtering method, a laser ablation method, a plasma CVD method, an optical CVD method, or a hot wire CVD method, or a wet film formation method such as a spin coating method, a deep coating method, or a screen printing method, depending on materials. The protective film 6 may use two or more layers which are laminated, and may use a mixture of the inorganic insulating material with the organic insulating material.

The protective film 6 functions as an etching stopper, and after the protective film 6 is patterned, a plasma treatment is performed only for the contact portions with the source electrode 7 and the drain electrode 8 while protecting the channel region of the semiconductor active layer 5. Thereby, it is possible to improve conductivity of the contact portions with the source electrode 7 and the drain electrode 8 of the semiconductor active layer 5 exposed from the protective film 6, and thus it is possible to reduce contact resistance between the semiconductor active layer 5 and the source electrode 7 and the drain electrode 8.

In addition, as shown in FIG. 5, the protective film may have a multi-layer structure, and, in the third embodiment, a lattice-shaped protective film 6b is formed at the lower part of a lattice-shaped light blocking protective film 6a. In this case as well, the protective films may be formed in the same manner as the first embodiment.

Figure 13D:
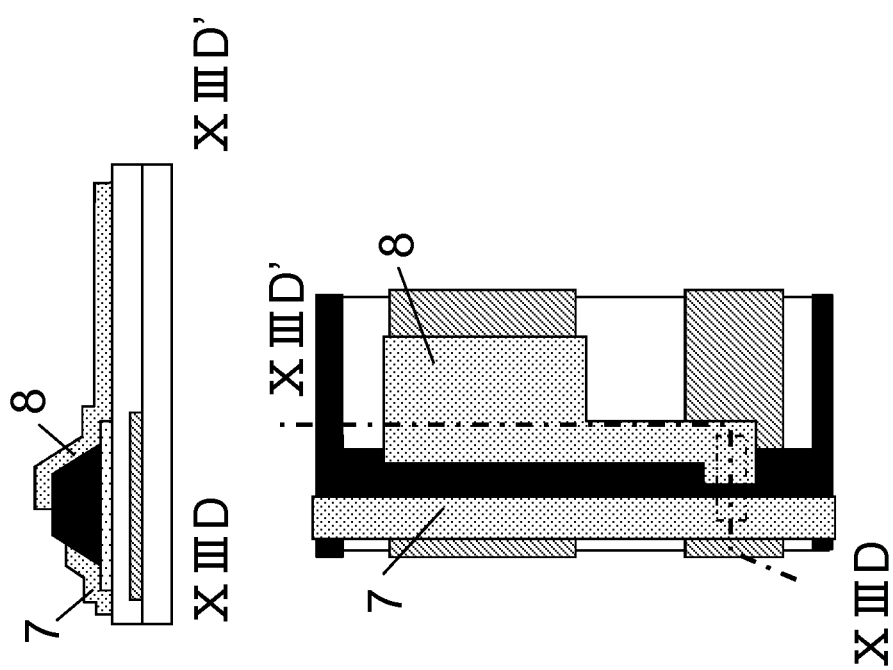

Next, the source and the drain are formed. A conductive material as a material of the wires and the electrodes is formed on the entire substrate and covers the entire substrate including the protective film 6. In addition, patterning is performed such that the source electrode and the drain electrode cover two exposed surfaces of the semiconductor active layer 5 and are electrically connected thereto. At this time, the drain electrode connected to a pixel electrode is preferably patterned so as to hang on the top portion of the protective film 6 (FIG. 13D). Materials and formation methods of the source and drain are the same as described above. In the active matrix substrate shown in FIGS. 12A and 12B, the source electrode and the source wire are integrally formed in a stripe shape. In addition, the drain electrode has the pixel electrode connection portion on the protective film 6 as described above, and is formed in such a shape where the drain electrode is located rightly over the capacitor electrode.

Figure 14A:
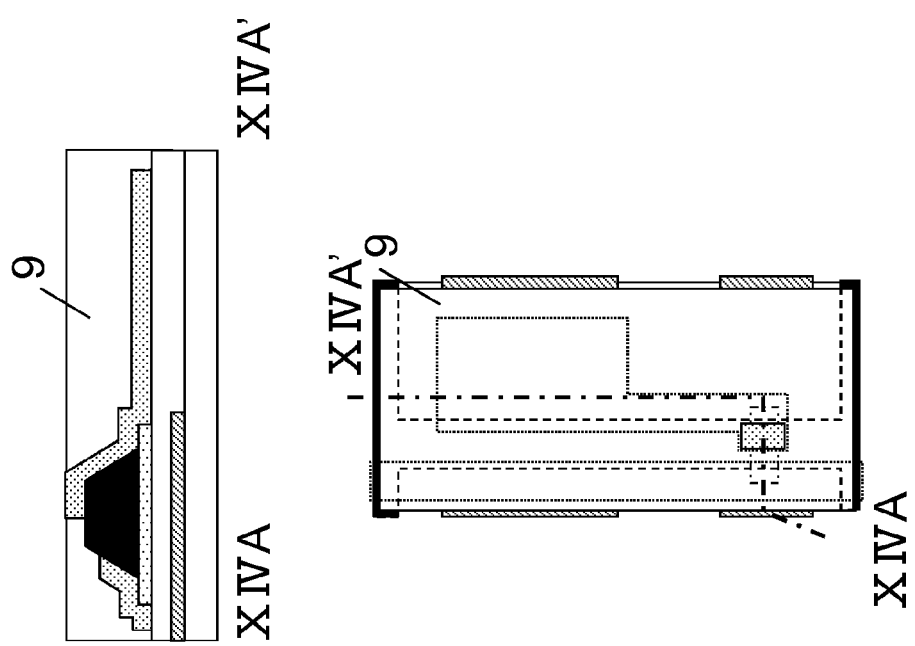
FIGS. 14A and 14B are schematic cross-sectional views and plan views illustrating manufacturing steps of an active matrix substrate according to a third embodiment of the present invention, wherein the schematic cross-sectional views (upper parts) are respectively taken along the lines XIVA-XIVA', and XIVB-XIVB' of the plan views (lower parts).

Next, an interlayer insulating layer 9 for insulating the source electrode and the pixel electrode is formed on the substrate provided with the source and the drain (FIG. 14A).

The interlayer insulating layer 9 according to the third embodiment of the present invention may be formed in the same manner as the first embodiment.

The interlayer insulating layer 9 has an opening portion on the protective film 6, and thus the drain electrode 8 can be connected to the pixel electrode 10 on the protective film. The opening portion is provided using a well-known method such as a photolithography method or etching when or after the protective film is formed. In addition, color filter materials including pigments or dyes such as, for example, red, green, and blue may be used in the interlayer insulating layer 9. When the color filter materials are used in the interlayer insulating layer 9, it is possible to manufacture a COA substrate where a color filter is formed on the thin film transistor. In the COA substrate, since position alignment between the thin film transistor and the color filter is easy, and position alignment errors are made to be small, it is expected to improve an aperture ratio or a yield. In addition, in a case of forming the pigmented layers, the protective film 6 may be used a separator (barrier) of the pigmented layers. Therefore, particularly, in a case where the respective pigmented layers are formed to be applied and separated, by using a variety of printing methods, it is possible to form the pigmented layers of each pixels without color mixing.

Figure 14B:
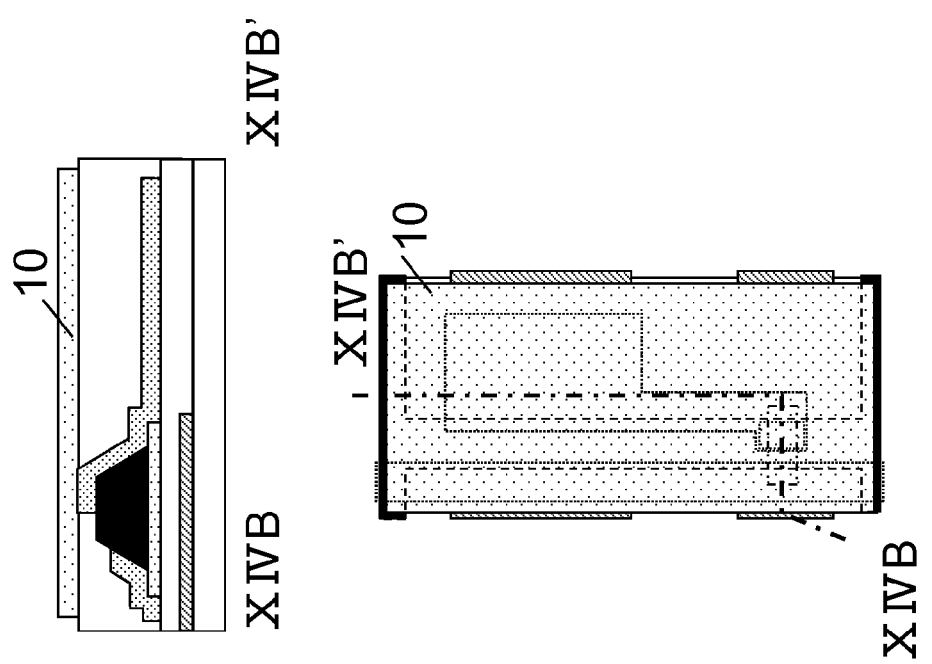

Finally, a film is formed on the interlayer insulating layer 9 using a conductive material and is patterned into a predetermined pixel shape so as to form the pixel electrode 10, thereby forming the active matrix substrate of the present invention. In FIG. 14B, the height of the drain electrode 8 formed on the top portion of the protective film 6 corresponds with the surface of the interlayer insulating layer, but the present invention is not limited thereto. For example, in a case where the height of the top portion of the protective film 6 is smaller than the surface of the interlayer insulating layer, as shown in FIGS. 4A and 4B, an opening portion is formed in the interlayer insulating layer so as to expose the drain electrode, and the pixel electrode is formed thereon, thereby electrically connecting the drain electrode to the pixel electrode (FIG. 4B). On the other hand, in a case where the height of the top portion of the protective film 6 is the same or larger than the surface of the interlayer insulating layer, the drain electrode is projected upward from the interlayer insulating layer, electrical connection becomes easy. Any case is possible in a range where the drain electrode is electrically connected to the pixel electrode, the source electrode is insulated by being covered by the interlayer insulating layer, and thereby the display element 11 is not hindered.

The image display element 11 and the opposite electrode 12 are laminated on the active matrix substrate of the present invention created in this way, thereby manufacturing the image display device as shown in FIGS. 12A and 12B. Examples of the image display element may include an electrophoretic display medium (electronic paper), a liquid crystal display medium, an organic EL, an inorganic EL, and the like. As a laminating method, a method where the active matrix substrate of the present invention is joined to the laminate of the opposite substrate 13, the opposite electrode, and the image display element, a method where the image display element, the opposite electrode, and the opposite substrate are sequentially laminated on the active matrix substrate of the present invention, or the like may be appropriately selected depending on the kind of image display element.

Hereinafter, the active matrix substrate and the image display device of the present invention will be described using Examples. In addition, the present invention is not limited to configurations of Examples.

EXAMPLES

Example 1

As the substantially transparent substrate 1, the non-alkali glass 1737 0.7 mm thick, made by Corning Incorporated, is used, a film is formed using ITO with the film thickness of 100 nm on one surface of the substantially transparent substrate 1 by the DC magnetron sputtering method, and a desired shape is patterned by the photolithography method. Specifically, a positive type resist is coated with the film thickness of 1 μm on the ITO film, exposure is performed using a mask where the desired shape is patterned, and, thereafter, developing is performed using an alkali developer, thereby forming a resist pattern having the desired shape. Thereafter, the substrate 1 is immersed into an ITO etchant so as to melt unnecessary ITO. The resist pattern is removed using a resist release solution, and thereby the gate 2 and the capacitor 3 shown in FIG. 2A are formed.

A film of silicon oxynitride (SiON) is formed with the film thickness of 300 nm on the substrate 1 provided with the gate 2 and the capacitor 3 by the RF magnetron sputtering method, thereby forming the gate insulating layer 4.

Next, a film of indium gallium zinc oxide (In—Ga—Zn—O) is formed with the film thickness of 40 nm on the gate insulating layer 4 by the RF magnetron sputtering method, and is patterned to the shape shown in FIG. 2B by the photolithography method, as described in the formation of the gate wire 2 and the capacitor wire 3, thereby forming the semiconductor active layer 5.

A photosensitive acryl resin is coated with the film thickness of 2 μm on the substrate provided with the semiconductor active layer 5, and the proximity exposure is performed so as to obtain a tapered shape. Thereafter, the resin is patterned to the shape shown in FIG. 2C on the semiconductor active layer through developing and baking, thereby forming the protective film 6 for protecting the channel region of the semiconductor active layer.

Next, a film of ITO is formed with the film thickness of 100 nm on the substrate provided with the protective film 6 by the DC magnetron sputtering method, and is patterned to the shape shown in FIG. 3A by the photolithography method, thereby forming the source electrode 7 and the drain electrode 8.

Next, photosensitive color filter materials respectively pigmented with red, green, and blue are coated with the film thickness of 1.5 μm on the substrate provided with the source electrode 7 and the drain electrode 8 as the interlayer insulating layer 9, and are patterned through exposure and developing, thereby forming the interlayer insulating layer 9 which is also used as a color filter layer. In addition, when the above-described interlayer insulating layer is patterned, the opening portion is provided in the interlayer insulating layer 9 on the drain electrode 8 formed on the protective film 6 in order to electrically connect the drain electrode 8 to the pixel electrode 10.

A film of ITO is formed with the film thickness of 100 nm on the substrate by the DC magnetron sputtering method, and is patterned by the photolithography method so as to form the pixel electrode 10, thereby manufacturing the active matrix substrate. The pixel electrode 10 is electrically connected to the drain electrode 8 via the opening portion of the interlayer insulating layer 9.

The Vizplex (registered trademark) Imaging Film manufactured by E Ink Corp. is joined to the manufactured thin film transistor as the image display element 11, the opposite electrode 12, and the opposite substrate 13, thereby manufacturing the image display device of Example 1.

Example 2

Figure 6A:
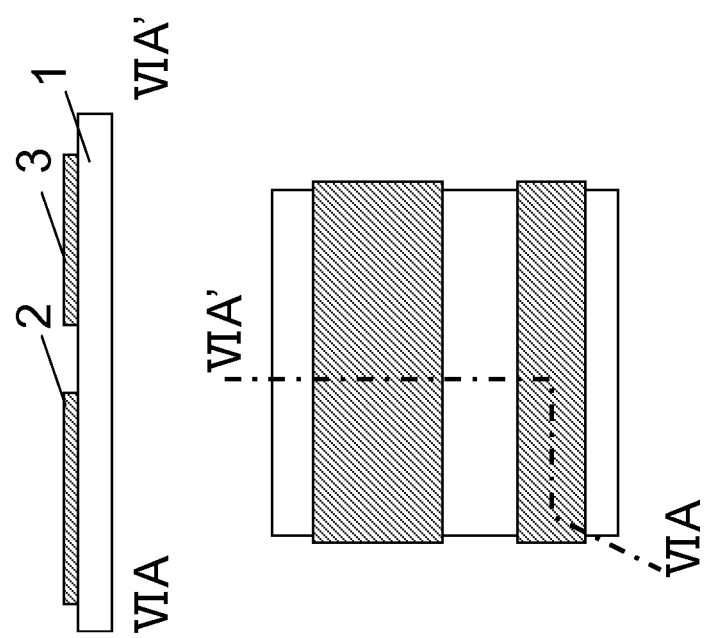

As the substantially transparent substrate 1, the non-alkali glass 1737 0.7 mm thick, made by Corning Incorporated, is used, a film is formed using ITO with the film thickness of 100 nm on one surface of the substantially transparent substrate 1 by the DC magnetron sputtering method, and a desired shape is patterned by the photolithography method. Specifically, a positive type resist is coated on the ITO film with the film thickness of 1 μm, exposure is performed using a mask where the desired shape is patterned, and, thereafter, developing is performed using an alkali developer, thereby forming a resist pattern having the desired shape. Thereafter, the substrate 1 is immersed into an ITO etchant so as to melt unnecessary ITO. The resist pattern is removed using a resist release solution, and thereby the gate 2 and the capacitor 3 shown in FIG. 6A are formed.

A film of silicon oxynitride (SiON) is formed with the film thickness of 300 nm on the substrate 1 provided with the gate 2 and the capacitor 3 by the RF magnetron sputtering method, thereby forming the gate insulating layer 4.

Next, a film of indium gallium zinc oxide (In—Ga—Zn—O) is formed with the film thickness of 40 nm on the gate insulating layer 4 by the RF magnetron sputtering method, and is patterned to the shape shown in FIG. 6B by the photolithography method, as described in the formation of the gate wire 2 and the capacitor wire 3, thereby forming the semiconductor active layer 5.

Figure 6C:
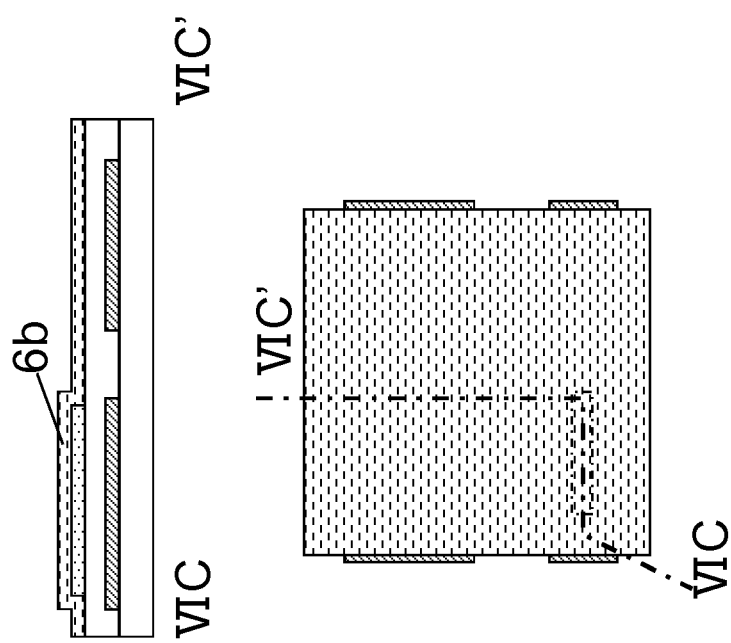
Figure 6D:
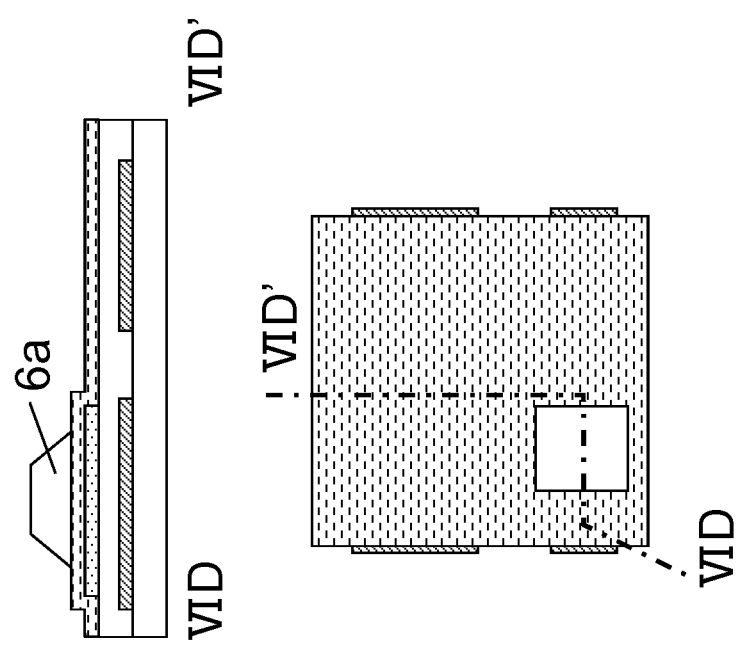

An SiON film is formed with the film thickness of 80 nm on the substrate provided with the semiconductor active layer 5 by the RF sputtering method (FIG. 6C). A photosensitive acryl resin is coated with the film thickness of 2 μm thereon, and exposure and developing are performed, thereby forming the pattern of the protective film 6a shown in FIG. 6D on the semiconductor active layer 5. Thereafter, the SiON film is etched using the pattern of the protective film 6a formed from the acryl resin as a mask by the reactive ion etching, thereby forming the protective film 6 formed of the lower protective film 6b of an inorganic film and the upper protective film 6b of an organic film (FIG. 7A). In addition, after the SiON film is etched, the Ar plasma treatment is performed for the portion exposed from the protective film 6 of the semiconductor active layer 5.

Figure 7B:
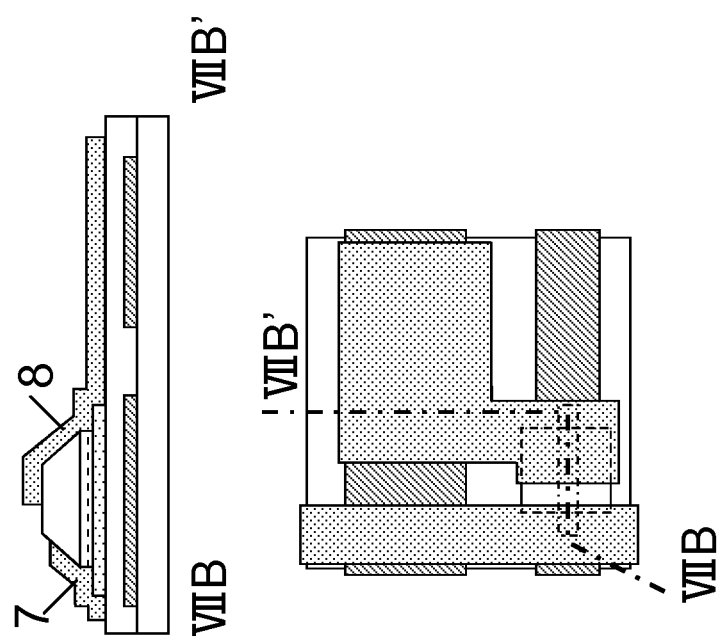

Next, a film of ITO is formed with the film thickness of 100 nm by the DC magnetron sputtering method, and is patterned to the shape shown in FIG. 7B by the photolithography method, thereby forming the source 7 and the drain electrode 8.

Figure 7C:
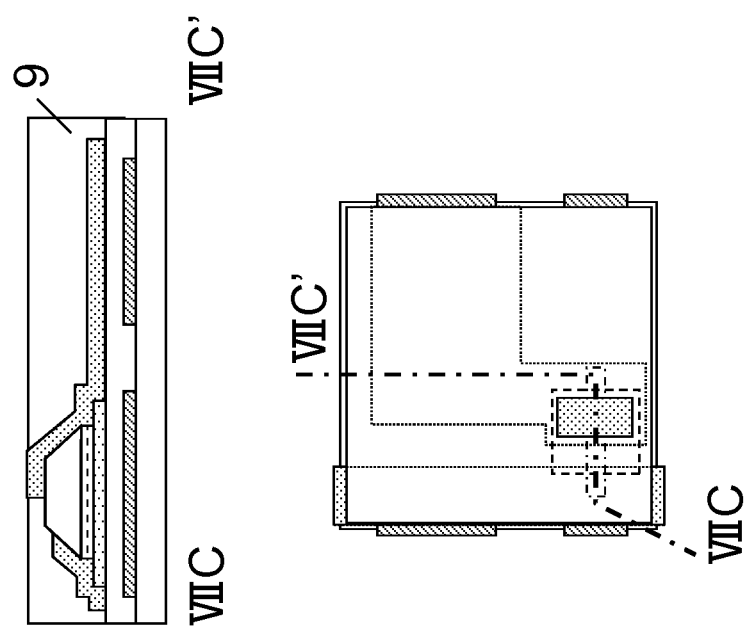

Next, photosensitive color filter materials respectively pigmented with red, green, and blue are coated with the film thickness of 1.5 μm on the substrate provided with the source electrode 7 and the drain electrode 8 as the interlayer insulating layer 9, and are patterned through exposure and developing, thereby forming the interlayer insulating layer 9 which is also used as a color filter layer (FIG. 7C). In addition, the opening portion is provided in the interlayer insulating layer 9 on the drain electrode 8 formed on the protective film 6 in order to electrically connect the drain electrode 8 to the pixel electrode 10.

Figure 7D:
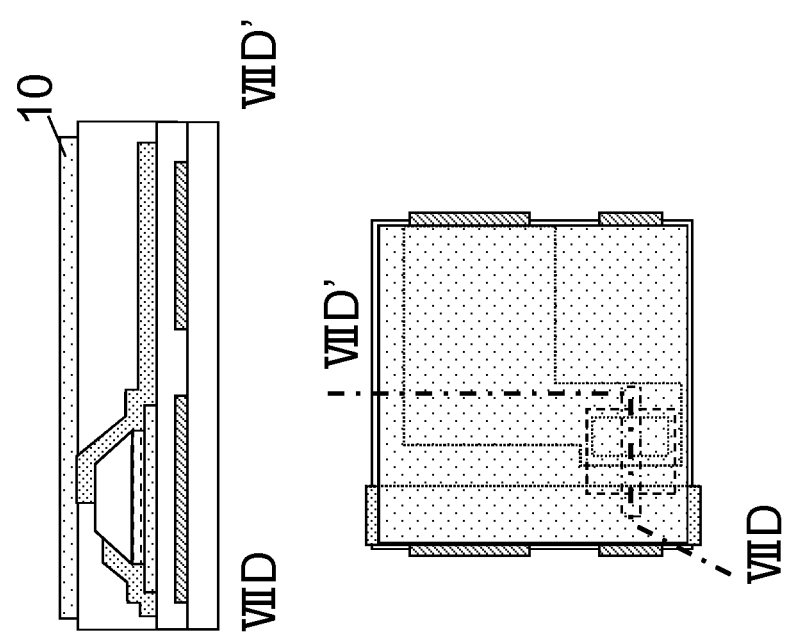

A film of ITO is formed with the film thickness of 100 nm by the DC magnetron sputtering method, and is patterned by the photolithography method so as to form the pixel electrode 10, thereby manufacturing the active matrix substrate. The pixel electrode 10 is electrically connected to the drain electrode 8 via the opening portion of the interlayer insulating layer 9 (FIG. 7D).

The Vizplex (registered trademark) Imaging Film manufactured by E Ink Corp. is joined to the manufactured thin film transistor as the image display element 11, the opposite electrode 12, and the opposite substrate 13, thereby manufacturing the image display device of Example 2.

Example 3

As the substantially transparent substrate 1, the non-alkali glass 1737 0.7 mm thick, made by Corning Incorporated, is used, a film is formed using ITO with the film thickness of 100 nm on one surface of the substantially transparent substrate 1 by the DC magnetron sputtering method, and a desired shape is patterned by the photolithography method. Specifically, a positive type resist is coated with the film thickness of 1 μm on the ITO film, exposure is performed using a mask where the desired shape is patterned, and, thereafter, developing is performed using an alkali developer, thereby forming a resist pattern having the desired shape. Thereafter, the substrate 1 is immersed into an ITO etchant so as to melt unnecessary ITO. The resist pattern is removed using a resist release solution, and thereby the gate 2 and the capacitor 3 shown in FIG. 9A are formed.

A film of silicon oxynitride (SiON) is formed with the film thickness of 300 nm on the substrate 1 provided with the gate 2 and the capacitor 3 by the RF magnetron sputtering method, thereby forming the gate insulating layer 4.

Next, a film of indium gallium zinc oxide (In—Ga—Zn—O) is formed with the film thickness of 40 nm on the gate insulating layer 4 by the RF magnetron sputtering method, and is patterned to the shape shown in FIG. 9B by the photolithography method, as described in the formation of the gate wire 2 and the capacitor wire 3, thereby forming the semiconductor active layer 5.

A photosensitive acryl resin is coated with the film thickness of 2 μm on the substrate provided with the semiconductor active layer 5, and the proximity exposure is performed so as to obtain a tapered shape. Thereafter, the resin is patterned to the stripe shape shown in FIG. 9C on the semiconductor active layer through developing and baking, thereby forming the protective film 6 for protecting the channel region of the semiconductor active layer.

Next, a film of ITO is formed with the film thickness of 100 nm on the substrate provided with the protective film 6 by the DC magnetron sputtering method, and is patterned to the shape shown in FIG. 10A by the photolithography method, thereby forming the source electrode 7 and the drain electrode 8.

Next, photosensitive color filter materials respectively pigmented with red, green, and blue are coated with the film thickness of 1.5 μm on the substrate provided with the source electrode 7 and the drain electrode 8 as the interlayer insulating layer 9, and are patterned through exposure and developing, thereby forming the interlayer insulating layer 9 which is also used as a color filter layer. In addition, when the above-described interlayer insulating layer is patterned, the opening portion is provided in the interlayer insulating layer 9 on the drain electrode 8 formed on the protective film 6 in order to electrically connect the drain electrode 8 to the pixel electrode 10.

A film of ITO is formed with the film thickness of 100 nm on the substrate by the DC magnetron sputtering method, and is patterned by the photolithography method so as to form the pixel electrode 10, thereby manufacturing the active matrix substrate. The pixel electrode 10 is electrically connected to the drain electrode 8 via the opening portion of the interlayer insulating layer 9.

The Vizplex (registered trademark) Imaging Film manufactured by E Ink Corp. is joined to the manufactured thin film transistor as the image display element 11, the opposite electrode 12, and the opposite substrate 13, thereby manufacturing the image display device of Example 3.

Example 4

As the substantially transparent substrate 1, the non-alkali glass 1737 0.7 mm thick, made by Corning Incorporated, is used, a film is formed using ITO with the film thickness of 100 nm on one surface of the substantially transparent substrate 1 by the DC magnetron sputtering method, and a desired shape is patterned by the photolithography method. Specifically, a positive type resist is coated on the ITO film with the film thickness of 1 μm, exposure is performed using a mask where the desired shape is patterned, and, thereafter, developing is performed using an alkali developer, thereby forming a resist pattern having the desired shape. Thereafter, the substrate 1 is immersed into an ITO etchant so as to melt unnecessary ITO. The resist pattern is removed using a resist release solution, and thereby the gate 2 and the capacitor 3 shown in FIG. 13A are formed.

A film of silicon oxynitride (SiON) is formed with the film thickness of 300 nm on the substrate 1 provided with the gate 2 and the capacitor 3 by the RF magnetron sputtering method, thereby forming the gate insulating layer 4.

Next, a film of indium gallium zinc oxide (In—Ga—Zn—O) is formed with the film thickness of 40 nm on the gate insulating layer 4 by the RF magnetron sputtering method, and is patterned to the shape shown in FIG. 13B by the photolithography method, as described in the formation of the gate wire 2 and the capacitor wire 3, thereby forming the semiconductor active layer 5.

A photosensitive acryl resin into which carbon black is dispersed is coated with the film thickness of 2 μm on the substrate provided with the semiconductor active layer 5, and the proximity exposure is performed so as to obtain a tapered shape. Thereafter, the lattice-shaped protective film 6 is patterned on the semiconductor active layer such that one side thereof through developing and baking, thereby forming the protective film 6 for protecting the channel region of the semiconductor active layer.

Next, a film of ITO is formed with the film thickness of 100 nm on the substrate provided with the protective film 6 by the DC magnetron sputtering method, and is patterned to the shape shown in FIG. 13D by the photolithography method, thereby forming the source electrode 7 and the drain electrode 8.

Next, photosensitive color filter materials respectively pigmented with red, green, and blue are coated with the film thickness of 1.5 μm on the substrate provided with the source electrode 7 and the drain electrode 8 as the interlayer insulating layer 9 respectively at the opening portion of the protective layer 6, and are patterned through exposure and developing, thereby forming the interlayer insulating layer 9 which is also used as a color filter layer. In addition, when the above-described interlayer insulating layer is patterned, the opening portion is provided in the interlayer insulating layer 9 on the drain electrode 8 formed on the protective film 6 in order to electrically connect the drain electrode 8 to the pixel electrode 10.

A film of ITO is formed with the film thickness of 100 nm on the substrate by the DC magnetron sputtering method, and is patterned by the photolithography method so as to form the pixel electrode 10, thereby manufacturing the active matrix substrate. The pixel electrode 10 is electrically connected to the drain electrode 8 via the opening portion of the interlayer insulating layer 9.

The Vizplex (registered trademark) Imaging Film manufactured by E Ink Corp. is joined to the manufactured thin film transistor as the image display element 11, the opposite electrode 12, and the opposite substrate 13, thereby manufacturing the image display device of Example 4.

It is confirmed that all the image display devices manufactured in Examples 1 to 4 are operated without pixel defects.

What is claimed is:

1. An active matrix substrate comprising:
   a plurality of pixels which are arranged on a substrate and each of which includes a thin film transistor,
   wherein the thin film transistor includes a gate electrode, a gate insulating layer on the gate electrode, a semiconductor active layer on the gate insulating layer, a source electrode connected to the semiconductor active layer, a drain electrode connected to the semiconductor active layer, a pixel electrode connected to the drain electrode, and an interlayer insulating layer for insulating the source electrode from the pixel electrode,
   wherein a protective film is formed on the semiconductor active layer so as to divide the semiconductor active layer into two exposed regions, the source electrode is connected to one of the two exposed regions, the drain electrode is connected to the other of the two exposed regions, and the drain electrode is connected to the pixel electrode on the protective film, a connection point between the drain and the pixel electrode is above the protective film,
   wherein the plurality of thin film transistors are arranged in a straight line shape,
   wherein a plurality of independent semiconductor active layers which respectively constitute the plurality of thin film transistors are arranged in parallel and in a straight line shape, and
   wherein the protective film is continuously formed in a stripe shape over the plurality of semiconductor active layers so as to divide each of the plurality of semiconductor active layers into two exposed regions.

2. The active matrix substrate according to claim 1, wherein the protective film is formed in a forward tapered shape.

3. The active matrix substrate according to claim 1, wherein the protective film is formed from an organic insulating material.

4. The active matrix substrate according to claim 1, wherein the protective film is formed of a plurality of layers, and one layer of the plurality of layers coming into contact with at least the semiconductor active layer includes an inorganic insulating material.

5. The active matrix substrate according to claim 1, wherein the interlayer insulating layer is pigmented with a predetermined color.

6. The active matrix substrate according to claim 1, wherein the semiconductor active layer is formed from a metal oxide.

7. An image display comprising the active matrix substrate according to claim 1, wherein the image display is any one of a liquid crystal type, an organic electroluminescence type, and an electrophoretic type.

8. An active matrix substrate comprising:
a plurality of pixels which are arranged on a substrate and each of which includes a thin film transistor,
wherein the thin film transistor includes a gate electrode, a gate insulating layer on the gate electrode, a semiconductor active layer on the gate insulating layer, a source electrode connected to the semiconductor active layer, a drain electrode connected to the semiconductor active layer, a pixel electrode connected to the drain electrode, and an interlayer insulating layer for insulating the source electrode from the pixel electrode, and
wherein a protective film is formed on the semiconductor active layer so as to divide the semiconductor active layer into two exposed regions, the source electrode is connected to one of the two exposed regions, the drain electrode is connected to the other of the two exposed regions, and the drain electrode is connected to the pixel electrode on the protective film, and
wherein the protective film, is formed in a lattice shape for partitioning the pixels, and is formed so as to have a light blocking property.

9. A manufacturing method of an active matrix substrate including a plurality of pixels arranged on a substrate and each of which includes a thin film transistor, wherein the thin film transistor includes a gate electrode, a gate insulating layer on the gate electrode, a semiconductor active layer on the gate insulating layer, a source electrode connected to the semiconductor active layer, a drain electrode connected to the semiconductor active layer, a pixel electrode connected to the drain electrode, and an interlayer insulating layer for insulating the source electrode from the pixel electrode, the method comprising:
forming the gate electrode on the substrate;
forming the gate insulating layer on the gate electrode;
forming the semiconductor active layer on the gate insulating layer;
forming a protective film on the semiconductor active layer so as to divide the semiconductor active layer into two exposed regions;
forming a layer formed from a conductive material on the protective film, the semiconductor active layer, and an entire surface of the gate insulating layer
wherein forming the layer is through patterning such that the source electrode is connected to one of the two exposed regions, the drain electrode is connected to the other of the two exposed regions, and the drain electrode is left on the protective film;
forming the interlayer insulating layer on an entire surface of the substrate;
providing an opening portion in the interlayer insulating layer on the protective film; and
forming the pixel electrode on the interlayer insulating layer and electrically connecting the pixel electrode to the drain electrode, a connection point between the pixel electrode and the drain electrode is above the protective film,
wherein, in the forming of the protective film on the semiconductor active layer so as to divide the semiconductor active layer into the two exposed regions, the protective film is continuously formed in a stripe shape on each of the plurality of semiconductor active layers respectively constituting the plurality of thin film transistors so as to divide the semiconductor active layer into the two exposed regions.

10. The manufacturing method of the active matrix substrate according to claim 9, wherein the forming of the protective film includes:
forming a first protective film on the entire surface of the substrate;
forming a second protective film so as to divide the semiconductor active layer into the two exposed regions; and
removing the first protective film exposed from the second protective film through etching.

11. A manufacturing method of an active matrix substrate including a plurality of pixels arranged on a substrate and each of which includes a thin film transistor, wherein the thin film transistor includes a gate electrode, a gate insulating layer on the gate electrode, a semiconductor active layer on the gate insulating layer, a source electrode connected to the semiconductor active layer, a drain electrode connected to the semiconductor active layer, a pixel electrode connected to the drain electrode, and an interlayer insulating layer for insulating the source electrode from the pixel electrode, the method comprising:
forming the gate electrode on the substrate;
forming the gate insulating layer on the gate electrode;
forming the semiconductor active layer on the gate insulating layer;
forming a protective film on the semiconductor active layer so as to divide the semiconductor active layer into two exposed regions;
forming a layer formed from a conductive material on the protective film, the semiconductor active layer, and an entire surface of the gate insulating layer
wherein forming the layer is through patterning such that the source electrode is connected to one of the two exposed regions, the drain electrode is connected to the other of the two exposed regions, and the drain electrode is left on the protective film;
forming the interlayer insulating layer on an entire surface of the substrate;
providing an opening portion in the interlayer insulating layer on the protective film; and
forming the pixel electrode on the interlayer insulating layer and electrically connecting the pixel electrode to the drain electrode,
wherein, in the forming of the protective film on the semiconductor active layer so as to divide the semiconductor active layer into the two exposed regions, the protective film is formed in a stripe shape on each of the plurality of semiconductor active layers respectively constituting the plurality of thin film transistors so as to divide the semiconductor active layer into the two exposed regions, and
wherein the protective film is formed in the stripe shape using a printing method.

12. A manufacturing method of an active matrix substrate including a plurality of pixels arranged on a substrate and each of which includes a thin film transistor, wherein the thin film transistor includes a gate electrode, a gate insulating layer on the gate electrode, a semiconductor active layer on the gate insulating layer, a source electrode connected to the semiconductor active layer, a drain electrode connected to the semiconductor active layer, a pixel electrode connected to the drain electrode, and an interlayer insulating layer for insulating the source electrode from the pixel electrode, the method comprising:
  forming the gate electrode on the substrate;
  forming the gate insulating layer on the gate electrode;
  forming the semiconductor active layer on the gate insulating layer;
  forming a protective film on the semiconductor active layer so as to divide the semiconductor active layer into two exposed regions;
  forming a layer formed from a conductive material on the protective film, the semiconductor active layer, and an entire surface of the gate insulating layer
  wherein forming the layer is through patterning such that the source electrode is connected to one of the two exposed regions, the drain electrode is connected to the other of the two exposed regions, and the drain electrode is left on the protective film;
  forming the interlayer insulating layer on an entire surface of the substrate;
  providing an opening portion in the interlayer insulating layer on the protective film; and
  forming the pixel electrode on the interlayer insulating layer and electrically connecting the pixel electrode to the drain electrode,
  wherein, in the forming of the protective film on the semiconductor active layer so as to divide the semiconductor active layer into the two exposed regions, a lattice-shaped light blocking protective film is formed on the semiconductor active layer so as to divide the semiconductor active layer into the two exposed regions and partition the pixels from each other.

13. A manufacturing method of an active matrix substrate including a plurality of pixels arranged on a substrate and each of which includes a thin film transistor, wherein the thin film transistor includes a gate electrode, a gate insulating layer on the gate electrode, a semiconductor active layer on the gate insulating layer, a source electrode connected to the semiconductor active layer, a drain electrode connected to the semiconductor active layer, a pixel electrode connected to the drain electrode, and an interlayer insulating layer for insulating the source electrode from the pixel electrode, the method comprising:
  forming the gate electrode on the substrate;
  forming the gate insulating layer on the gate electrode;
  forming the semiconductor active layer on the gate insulating layer;
  forming a protective film on the semiconductor active layer so as to divide the semiconductor active layer into two exposed regions;
  forming a layer formed from a conductive material on the protective film, the semiconductor active layer, and an entire surface of the gate insulating layer
  wherein forming the layer is through patterning such that the source electrode is connected to one of the two exposed regions, the drain electrode is connected to the other of the two exposed regions, and the drain electrode is left on the protective film;
  forming the interlayer insulating layer on an entire surface of the substrate;
  providing an opening portion in the interlayer insulating layer on the protective film; and
  forming the pixel electrode on the interlayer insulating layer and electrically connecting the pixel electrode to the drain electrode,
  further comprising performing plasma irradiation for a region exposed from the protective film on the semiconductor active layer, the plasma irradiation performed after the forming of the protective film.

* * * * *